United States Patent
Joda et al.

(10) Patent No.: US 12,503,767 B2
(45) Date of Patent: *Dec. 23, 2025

(54) NON-TRANSITORY COMPUTER-READABLE RECORDING MEDIUM, SUBSTRATE PROCESSING APPARATUS AND SUBSTRATE PROCESSING METHOD

(71) Applicant: Kokusai Electric Corporation, Tokyo (JP)

(72) Inventors: Takuya Joda, Toyama (JP); Yukinao Kaga, Toyama (JP); Yoshimasa Nagatomi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/651,088

(22) Filed: Apr. 30, 2024

(65) Prior Publication Data

US 2024/0279807 A1 Aug. 22, 2024

Related U.S. Application Data

(63) Continuation of application No. 17/466,884, filed on Sep. 3, 2021, now Pat. No. 12,000,045, which is a (Continued)

(30) Foreign Application Priority Data

Mar. 6, 2019 (JP) .................................. 2019-040371

(51) Int. Cl.
*C23C 16/455* (2006.01)
*C23C 16/30* (2006.01)
(Continued)

(52) U.S. Cl.
CPC ...... *C23C 16/45557* (2013.01); *C23C 16/303* (2013.01); *C23C 16/52* (2013.01); *H01L 21/28568* (2013.01); *H10B 43/27* (2023.02)

(58) Field of Classification Search
CPC ............ C23C 16/45557; C23C 16/455; C23C 16/303; C23C 16/30; C23C 16/52;
(Continued)

(56) References Cited

U.S. PATENT DOCUMENTS 9,187,826 B2 11/2015 Nakatani et al.
9,558,937 B2 1/2017 Nakatani et al.
(Continued)

FOREIGN PATENT DOCUMENTS

CN 101908481 A 12/2010
CN 109075069 A 12/2018
(Continued)

OTHER PUBLICATIONS

First Office Action Notification with English translation in Chinese Application No. 20208018060, dated Dec. 16, 2022, 12 pages.

*Primary Examiner* — Nikolay K Yushin
(74) *Attorney, Agent, or Firm* — Edell, Shapiro & Finnan, LLC

(57) ABSTRACT

Described herein is a technique capable of improving characteristics of a film. According to one or more embodiments of the present disclosure, there is provided a technique that includes: (a) performing (a-1) supplying in parallel a metal-containing gas and a reducing gas that contains silicon and hydrogen and is free of halogen to a substrate in a process chamber, and (a-2) exhausting an inner atmosphere of the process chamber; (b) repeatedly performing (a) a first number of times; (c) supplying a nitrogen-containing gas to the substrate in the process chamber and exhausting the inner
(Continued)

atmosphere of the process chamber after performing (b); and (d) repeatedly performing (a) a second number of times.

20 Claims, 10 Drawing Sheets

Related U.S. Application Data continuation of application No. PCT/JP2020/006792, filed on Feb. 20, 2020.

(51) Int. Cl.
*C23C 16/52* (2006.01)
*H01L 21/285* (2006.01)
*H10B 43/27* (2023.01)

(58) Field of Classification Search
CPC ... C23C 16/279; C23C 16/4401; C23C 16/44; C23C 16/45523; C23C 16/34; C23C 16/45527; C23C 16/45553; H01L 21/28568; H01L 21/28518; H01L 21/285; H01L 21/28556; H01L 21/28537; H01L 21/28562; H01L 21/32051; H01L 21/3205; H01L 21/76841; H01L 21/768; H10B 43/27; H10B 43/40; H10B 43/35
See application file for complete search history.

(56) References Cited

U.S. PATENT DOCUMENTS

| | | |
|---|---|---|
| 2010/0297846 A1 | 11/2010 | Kaga et al. |
| 2010/0311251 A1 | 12/2010 | Okada et al. |
| 2014/0295667 A1 | 10/2014 | Kaga et al. |
| 2015/0093911 A1 | 4/2015 | Nakatani et al. |
| 2015/0303051 A1 | 10/2015 | Takeda |
| 2016/0042940 A1 | 2/2016 | Nakatani et al. |
| 2018/0374734 A1 | 12/2018 | Hirano et al. |
| 2019/0019673 A1 | 1/2019 | Ogawa et al. |
| 2019/0304791 A1 | 10/2019 | Degai |
| 2020/0194269 A1 | 6/2020 | Ogawa et al. |
| 2020/0258736 A1 | 8/2020 | Okuda et al. |
| 2022/0093392 A1 | 3/2022 | Joda et al. |
| 2022/0259738 A1 | 8/2022 | Ogawa |
| 2023/0230845 A1 | 7/2023 | Kuribayashi et al. |
| 2023/0335404 A1 | 10/2023 | Ogawa et al. |

FOREIGN PATENT DOCUMENTS

| | | |
|---|---|---|
| JP | 2003-524888 A | 8/2003 |
| JP | 2011006783 A | 1/2011 |
| JP | 2014-175509 A | 9/2014 |
| JP | 2014208883 A | 11/2014 |
| JP | 2015207591 A | 11/2015 |
| WO | 2017168600 A1 | 11/2018 |
| WO | 2019058608 A1 | 6/2020 |

FIG. 10
| | CONVENTIONAL METHOD | PRESENT EMBODIMENT |
|---|---|---|
| TEM IMAGE | 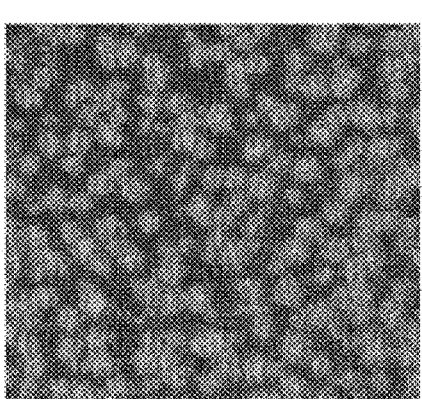 | 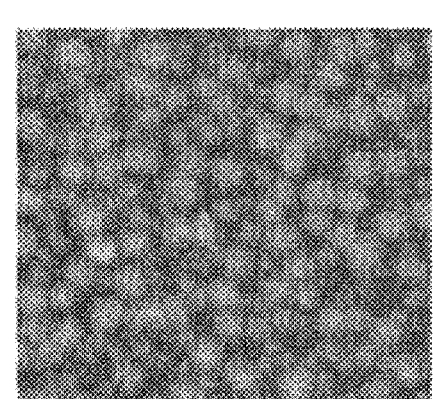 |
FIG. 11
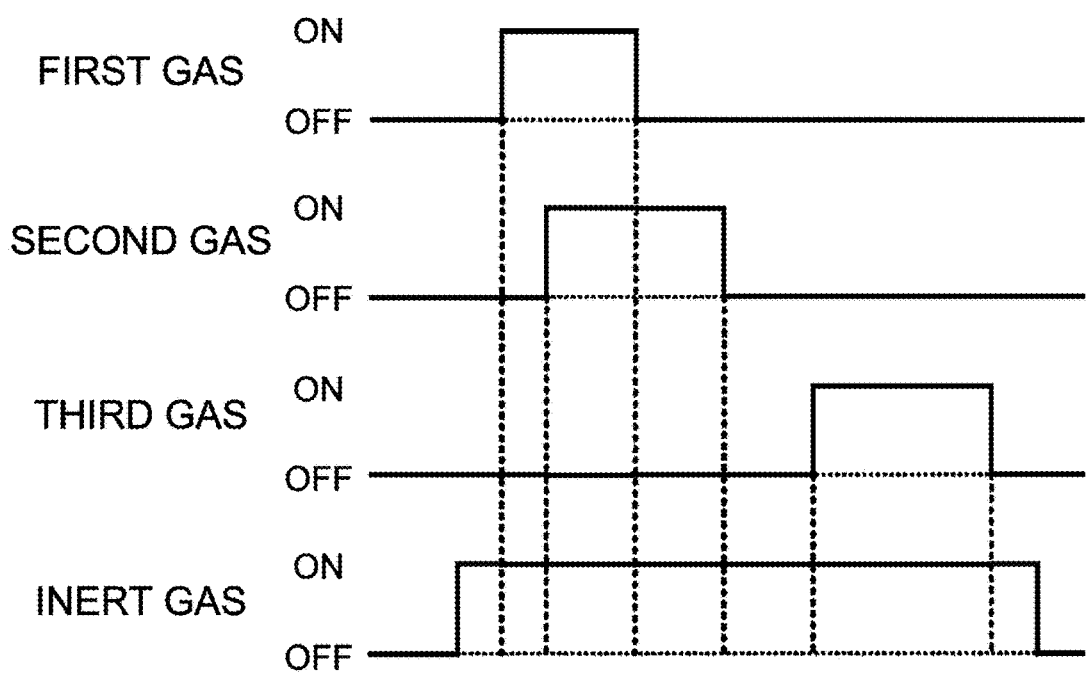

NON-TRANSITORY COMPUTER-READABLE RECORDING MEDIUM, SUBSTRATE PROCESSING APPARATUS AND SUBSTRATE PROCESSING METHOD

CROSS REFERENCE TO RELATED APPLICATIONS

This non-provisional U.S. patent application is a continuation of U.S. patent application Ser. No. 17/466,884 filed on Sep. 3, 2021 and claims priority under 35 U.S.C. § 119 of International Application No. PCT/JP2020/006792, filed on Feb. 20, 2020, in the WIPO, and Japanese Patent Application No. 2019-040371, filed on Mar. 6, 2019, in the Japanese Patent Office, the entire contents of which are hereby incorporated by reference.

TECHNICAL FIELD

The present disclosure relates to a method of manufacturing a semiconductor device, a non-transitory computer-readable recording medium, a substrate processing apparatus and a substrate processing method.

BACKGROUND

For example, a film such as a tungsten film (also simply referred to as a "W film") is used as a control gate of a NAND type flash memory of a three-dimensional structure (also simply referred to as a "3D NAND"). For example, a tungsten hexafluoride (WF6) gas containing tungsten may be used to form the W film. In addition, a titanium nitride film (also simply referred to as a "TiN film") may be provided as a barrier film between the W film and an insulating film of the 3D NAND. The TiN film plays a role of enhancing the adhesion between the W film and the insulating film, and also plays a role of preventing fluorine (F) contained in the W film from diffusing into the insulating film. In general, the TiN film may be formed using titanium tetrachloride (TiCl4) gas and ammonia (NH3) gas.

As the 3D NAND is miniaturized, it is preferable to improve characteristics of the film.

SUMMARY

Described herein is a technique capable of improving characteristics of a film.

According to one or more embodiments of the present disclosure, there is provided a technique that includes: (a) performing (a-1) supplying in parallel a metal-containing gas and a reducing gas that contains silicon and hydrogen and is free of halogen to a substrate, and (a-2) exhausting an inner atmosphere of a space in which the substrate is accommodated; (b) performing (a) a first number of times; (c) supplying a nitrogen-containing gas to the substrate and exhausting the inner atmosphere of the space; and (d) repeatedly performing (c) a second number of times after performing (b).

BRIEF DESCRIPTION OF THE DRAWINGS

FIG. 10 is a diagram schematically illustrating a covering ratio according to each of a conventional method and the embodiments described herein.

FIG. 11 is a timing diagram schematically illustrating an example of a gas supply used in a second film-forming step of the substrate processing according to the embodiments described herein.

DETAILED DESCRIPTION

Embodiments

Figure 1:
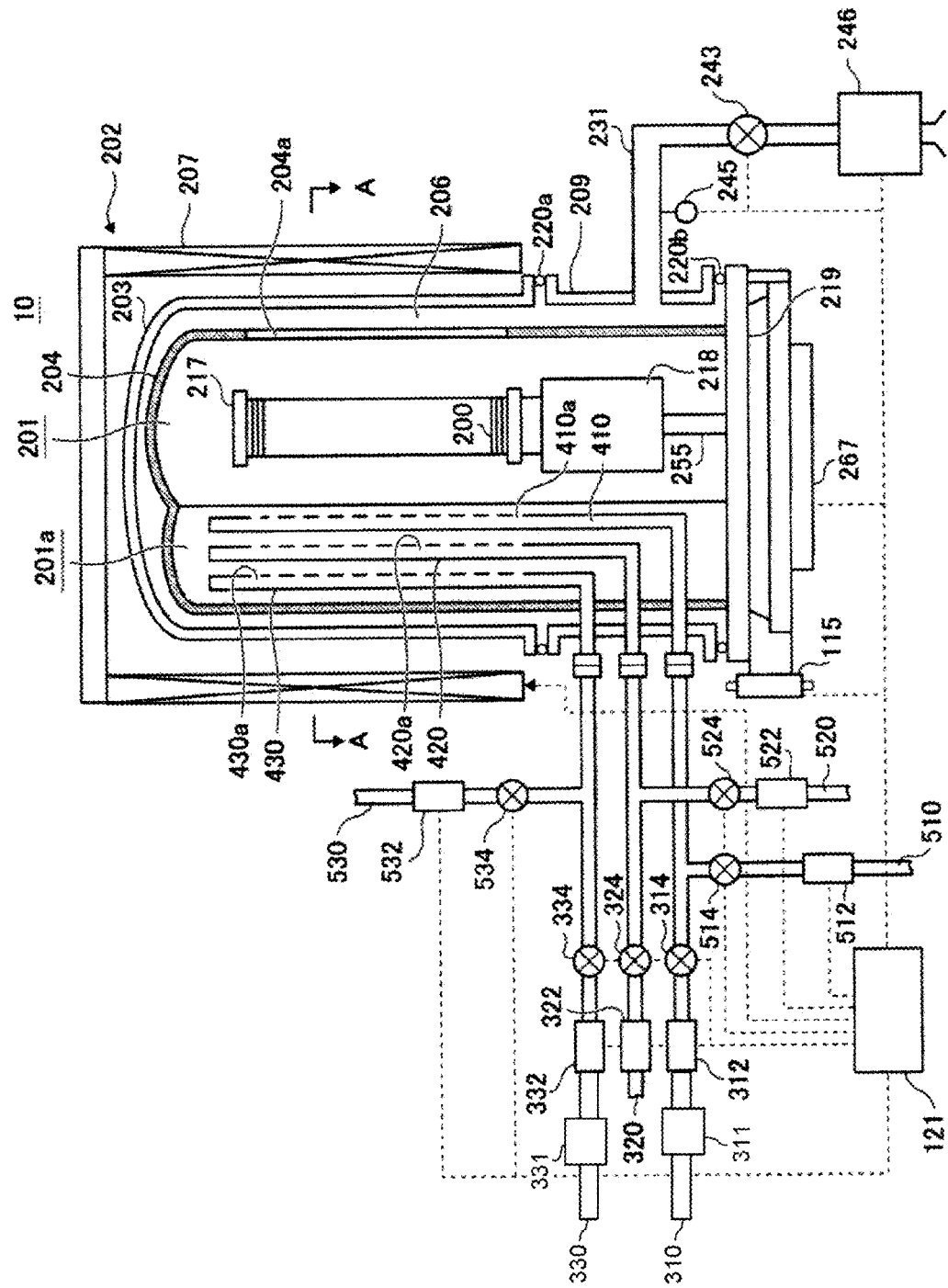
FIG. 1 is a diagram schematically illustrating a vertical cross-section of a vertical type process furnace of a substrate processing apparatus according to one or more embodiments described herein.

Hereinafter, one or more embodiments (also simply referred to as "embodiments") according to the technique of the present disclosure will be described with reference to the drawings.

(1) Configuration of Substrate Processing Apparatus

A substrate processing apparatus 10 according to the present embodiments includes a process furnace 202 such as a vertical type process furnace. The process furnace 202 includes a heater 207 serving as a heating apparatus (which is a heating structure or a heating system). The heater 207 is of a cylindrical shape, and is vertically installed while being supported by a heater base (not shown) serving as a support plate.

An outer tube 203 constituting a reaction vessel (which is a process vessel) is provided in an inner side of the heater 207 to be aligned in a manner concentric with the heater 207. Hereinafter, the outer tube 203 may be referred to as a reaction tube 203. For example, the outer tube 203 is made of a heat resistant material such as quartz ($SiO_2$) and silicon carbide (SiC). The outer tube 203 is of a cylindrical shape with a closed upper end and an open lower end. A manifold (which is an inlet flange) 209 is provided under the outer tube 203 to be aligned in a manner concentric with the outer tube 203. The manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction vessel is provided in an inner side of the outer tube 203. For example, the inner tube 204 is made of a heat resistant material such as quartz ($SiO_2$) and silicon carbide (SiC). The inner tube 204 is of a cylindrical shape with a closed upper end and an open lower end. The process vessel (reaction vessel) is constituted mainly by the outer tube 203, the inner tube 204 and the manifold 209. A process chamber 201 is provided in a hollow cylindrical portion of the process vessel (that is, an inside of the inner tube 204).

The process chamber 201 is configured to accommodate a plurality of wafers including a wafer 200 serving as a substrate vertically in a horizontal orientation in a multistage manner by a boat 217 described later. Hereinafter, the plurality of wafers including the wafer 200 may be simply referred to as wafers 200.

Nozzles 410, 420 and 430 are installed in the process chamber 201 so as to penetrate a side wall of the manifold 209 and the inner tube 204. Gas supply pipe 310, 320 and 330 are connected to the nozzles 410, 420 and 430, respectively. However, the process furnace 202 of the present embodiments is not limited to the exemplary configuration described above.

Mass flow controllers (MFCs) 311, 322 and 331 serving as flow rate controllers (flow rate control devices) and valves 314, 324 and 334 serving as opening/closing valves are sequentially installed at the gas supply pipes 310, 320 and 330 from upstream sides to downstream sides of the gas supply pipes 310, 320 and 330, respectively. Gas supply pipes 510, 520 and 530 configured to supply an inert gas are connected to the gas supply pipes 310, 320 and 330 at downstream sides of the valves 314, 324 and 334, respectively. MFCs 512, 522 and 532 serving as flow rate controllers (flow rate control devices) and valves 514, 524 and 534 serving as opening/closing valves are sequentially installed at the gas supply pipes 510, 520 and 530 from upstream sides to downstream sides of the gas supply pipes 510, 520 and 530, respectively.

The nozzles 410, 420 and 430 are connected to front ends (tips) of the gas supply pipes 310, 320 and 330, respectively. Each of the nozzles 410, 420 and 430 may include an L-shaped nozzle. Horizontal portions of the nozzles 410, 420 and 430 are installed so as to penetrate the side wall of the manifold 209 and the inner tube 204. Vertical portions of the nozzles 410, 420 and 430 are installed in a spare chamber 201a of a channel shape (a groove shape) protruding outward in a radial direction of the inner tube 204 and extending in the vertical direction. That is, the vertical portions of the nozzles 410, 420 and 430 are installed in the spare chamber 201a toward the upper end of the inner tube 204 (in a direction in which the wafers 200 are arranged) and along an inner wall of the inner tube 204.

The nozzles 410, 420 and 430 extend from a lower region of the process chamber 201 to an upper region of the process chamber 201. The nozzles 410, 420 and 430 are provided with a plurality of gas supply holes 410a, a plurality of gas supply holes 420a and a plurality of gas supply holes 430a facing the wafers 200, respectively. Thereby, a process gas can be supplied to the wafers 200 through the plurality of gas supply holes 410a of the nozzle 410, the plurality of gas supply holes 420a of the nozzle 420 and the plurality of gas supply holes 430a of the nozzle 430. The plurality of gas supply holes 410a, the plurality of gas supply holes 420a and the plurality of gas supply holes 430a are provided from a lower portion to an upper portion of the inner tube 204. An opening area of each of the gas supply holes 410a, the gas supply holes 420a and the gas supply holes 430a is the same, and each of the gas supply holes 410a, the gas supply holes 420a and the gas supply holes 430a is provided at the same pitch. However, the plurality of gas supply holes 410a, the plurality of gas supply holes 420a and the plurality of gas supply holes 430a are not limited thereto. For example, the opening area of each of the gas supply holes 410a, the gas supply holes 420a and the gas supply holes 430a may gradually increase from the lower portion to the upper portion of the inner tube 204 to further uniformize a flow rate of a gas such as the process gas supplied through the plurality of gas supply holes 410a, the plurality of gas supply holes 420a and the plurality of gas supply holes 430a.

The plurality of gas supply holes 410a of the nozzle 410, the plurality of gas supply holes 420a of the nozzle 420 and the plurality of gas supply holes 430a of the nozzle 430 are provided from a lower portion to an upper portion of the boat 217 described later. Therefore, the process gas supplied into the process chamber 201 through the plurality of gas supply holes 410a, the plurality of gas supply holes 420a and the plurality of gas supply holes 430a is supplied onto the wafers 200 accommodated in the boat 217 from the lower portion to the upper portion thereof, that is, the entirety of the wafers 200 accommodated in the boat 217. It is preferable that the nozzles 410, 420 and 430 extend from the lower region to the upper region of the process chamber 201. However, the nozzles 410, 420 and 430 may extend only to the vicinity of a ceiling of the boat 217.

A first flash tank 312 is provided between the MFC 311 and the valve 314 of the gas supply pipe 310.

A second flash tank 332 is provided between the MFC 331 and the valve 334 of the gas supply pipe 330.

A source gas containing a metal element (which is a metal-containing gas) serving as the process gas is supplied into the process chamber 201 through the gas supply pipe 310 provided with the MFC 311 and the valve 314 and the nozzle 410. As the source gas, for example, a halogen-based source (which is a halide or a halogen-based titanium source) gas such as titanium tetrachloride ($TiCl_4$) gas containing titanium (Ti) as the metal element may be used.

A reducing gas serving as the process gas is supplied into the process chamber 201 through the gas supply pipe 320 provided with the MFC 322 and the valve 324 and the nozzle 420. As the reducing gas, for example, silane ($SiH_4$) gas containing silicon (Si) and hydrogen (H) and free of halogen may be used. The $SiH_4$ gas may serve as a reducing agent.

A reactive gas serving as the process gas is supplied into the process chamber 201 through the gas supply pipe 330 provided with the MFC 331 and the valve 334 and the nozzle 430. As the reactive gas, for example, a nitrogen (N)-containing gas containing nitrogen (N) may be used. For example, ammonia ($NH_3$) gas may be used as the nitrogen-containing gas.

The inert gas such as nitrogen ($N_2$) gas is supplied into the process chamber 201 through the gas supply pipes 510, 520 and 530 provided with the MFCs 512, 522 and 532 and the valves 514, 524 and 534, respectively, and the nozzles 410, 420 and 430. While the present embodiments will be described by way of an example in which the $N_2$ gas is used as the inert gas, the inert gas according to the present embodiments is not limited thereto. For example, instead of the N$_2$ gas, a rare gas such as argon (Ar) gas, helium (He) gas, neon (Ne) gas and xenon (Xe) gas may be used as the inert gas.

A process gas supplier (which is a process gas supply system) is constituted mainly by the gas supply pipes 310, 320 and 330, the MFCs 311, 322 and 331, the valves 314, 324 and 334 and the nozzles 410, 420, 430. However, only the nozzles 410, 420 and 430 may be considered as the process gas supplier. The process gas supplier may also be simply referred to as a "gas supplier" or a "gas supply system". When the source gas is supplied through the gas supply pipe 310, a source gas supplier (which is a source gas supply system) is constituted mainly by the gas supply pipe 310, the MFC 311 and the valve 314. The source gas supplier may also be referred to as a "first gas supplier" or a "first gas supply system". The source gas supplier may further include the nozzle 410. The source gas supplier may further include the first flash tank 312. When the reducing gas is supplied through the gas supply pipe 320, a reducing gas supplier (which is a reducing gas supply system) is constituted mainly by the gas supply pipe 320, the MFC 322 and the valve 324. The reducing gas supplier may also be referred to as a "second gas supplier" or a "second gas supply system". The reducing gas supplier may further include the nozzle 420. When the reactive gas is supplied through the gas supply pipe 330, a reactive gas supplier (which is a reactive gas supply system) is constituted mainly by the gas supply pipe 330, the MFC 331 and the valve 334. The reactive gas supplier may also be referred to as a "third gas supplier" or a "third gas supply system". The reactive gas supplier may further include the nozzle 430. The reactive gas supplier may further include the second flash tank 332. When the nitrogen-containing gas serving as the reactive gas is supplied through the gas supply pipe 330, the reactive gas supplier may also be referred to as a "nitrogen-containing gas supplier" or a "nitrogen-containing gas supply system". An inert gas supplier (which is an inert gas supply system) is constituted mainly by the gas supply pipes 510, 520 and 530, the MFCs 512, 522 and 532 and the valves 514, 524 and 534.

According to the present embodiments, the gas is supplied into a vertically long annular space which is defined by the inner wall of the inner tube 204 and edges (peripheries) of the wafers 200 through the nozzles 410, 420 and 430 provided in the spare chamber 201a. The gas is ejected into the inner tube 204 through the plurality of gas supply holes 410a of the nozzle 410, the plurality of gas supply holes 420a of the nozzle 420 and the plurality of gas supply holes 430a of the nozzle 430 facing the wafers 200. Specifically, the gas such as the source gas is ejected into the inner tube 204 in a direction parallel to surfaces of the wafers 200 through the plurality of gas supply holes 410a of the nozzle 410, the plurality of gas supply holes 420a of the nozzle 420 and the plurality of gas supply holes 430a of the nozzle 430.

An exhaust hole (exhaust port) 204a is a through-hole facing the nozzles 410, 420 and 430 is provided at the side wall of the inner tube 204. For example, the exhaust hole 204a may be a narrow slit-shaped through-hole elongating vertically. The gas supplied into the process chamber 201 through the plurality of gas supply holes 410a of the nozzle 410, the plurality of gas supply holes 420a of the nozzle 420 and the plurality of gas supply holes 430a of the nozzle 430 flows over the surfaces of the wafers 200. The gas that has flowed over the surfaces of the wafers 200 is exhausted through the exhaust hole 204a into a gap (that is, an exhaust path 206) provided between the inner tube 204 and the outer tube 203. Then, the gas in the exhaust path 206 flows into an exhaust pipe 231 and is then discharged out of the process furnace 202.

The exhaust hole 204a is provided to face side surfaces of the wafers 200. The gas supplied in the vicinity of the wafers 200 in the process chamber 201 through the plurality of gas supply holes 410a, the plurality of gas supply holes 420a and the plurality of gas supply holes 430a flows in the horizontal direction. The gas that has flowed in the horizontal direction is exhausted through the exhaust hole 204a into the exhaust path 206. The exhaust hole 204a is not limited to the slit-shaped through-hole. For example, the exhaust hole 204a may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially installed at the exhaust pipe 231 from an upstream side to a downstream side of the exhaust pipe 231. With the vacuum pump 246 in operation, the APC valve 243 may be opened or closed to vacuum-exhaust the process chamber 201 or stop the vacuum exhaust. With the vacuum pump 246 in operation, the inner pressure of the process chamber 201 may be adjusted by adjusting an opening degree of the APC valve 243 (by adjusting an exhaust conductance). An exhauster (which is an exhaust system) is constituted mainly by the exhaust hole 204a, the exhaust path 206, the exhaust pipe 231, the APC valve 243 and the pressure sensor 245. However, the exhaust hole 204a alone may be considered as the exhauster. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the wafers 200 is provided at the seal cap 219 opposite to the process chamber 201. A rotating shaft 255 of the rotator 267 is connected to the boat 217 through the seal cap 219. As the rotator 267 rotates the boat 217, the wafers 200 are rotated. The seal cap 219 may be elevated or lowered in the vertical direction by a boat elevator 115 serving as an elevator provided outside the outer tube 203 vertically. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 serving as a substrate retainer is configured to accommodate (support) the wafers 200 (for example, 1 wafer to 200 wafers) while the wafers 200 are horizontally oriented with their centers aligned with each other with predetermined intervals therebetween in a multistage manner. For example, the boat 217 is made of a heat resistant material such as quartz and SiC. An insulating plate 218 horizontally oriented is provided under the boat 217 in a multistage manner (not shown). The insulating plate 218 is made of a heat resistant material such as quartz and SiC. The insulating plate 218 suppresses the transmission of the heat from the heater 207 to the seal cap 219. However, the present embodiments are not limited thereto. For example, instead of the insulating plate 218, a heat insulating cylinder (not shown) such as a cylinder made of a heat resistant material such as quartz and SiC may be provided under the boat 217.

Figure 2:
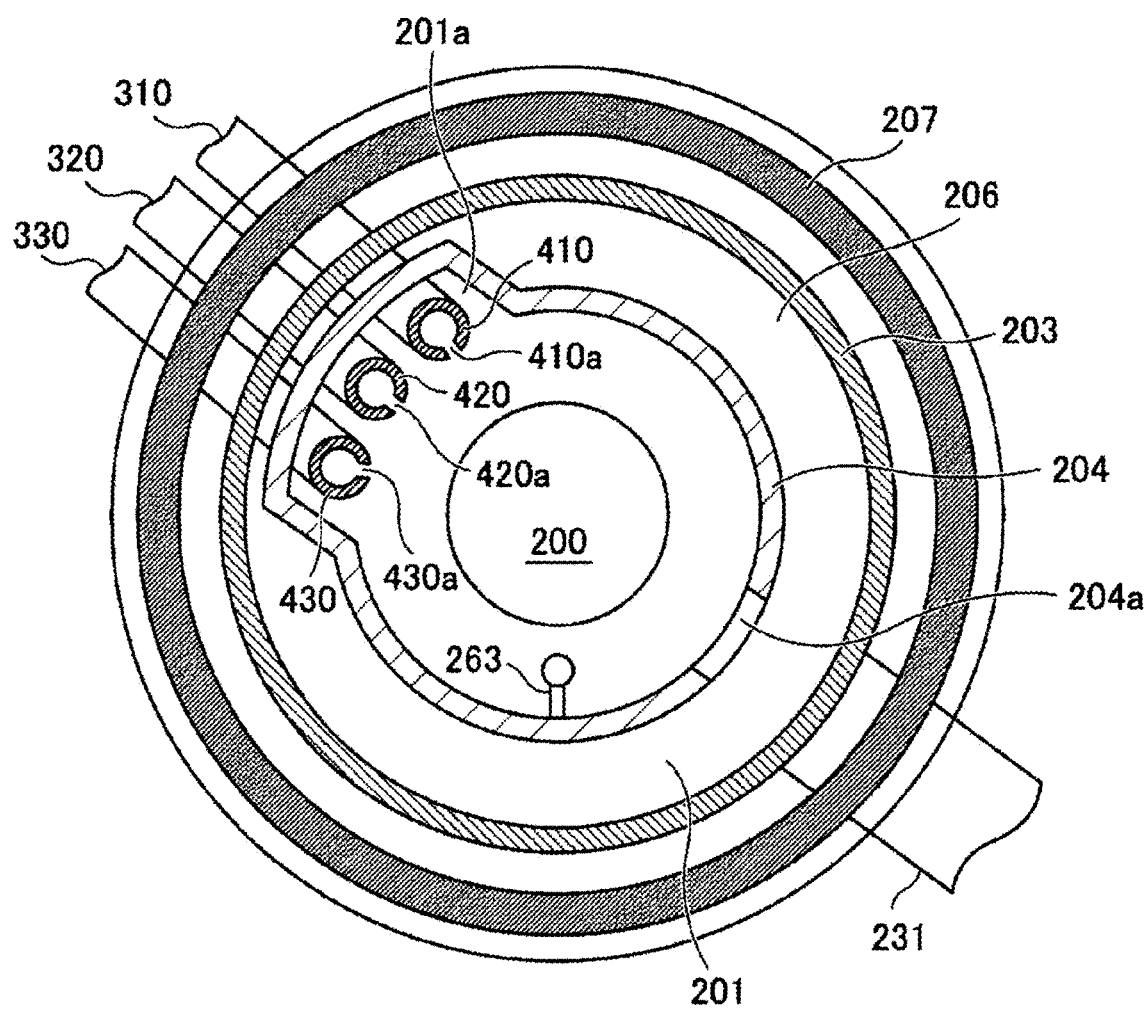
FIG. 2 is a diagram schematically illustrating a horizontal cross-section taken along the line A-A of the vertical type process furnace of the substrate processing apparatus shown in FIG. 1.

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410, 420 and 430, the temperature sensor 263 is L-shaped, and is provided along the inner wall of the inner tube 204.

Figure 3:
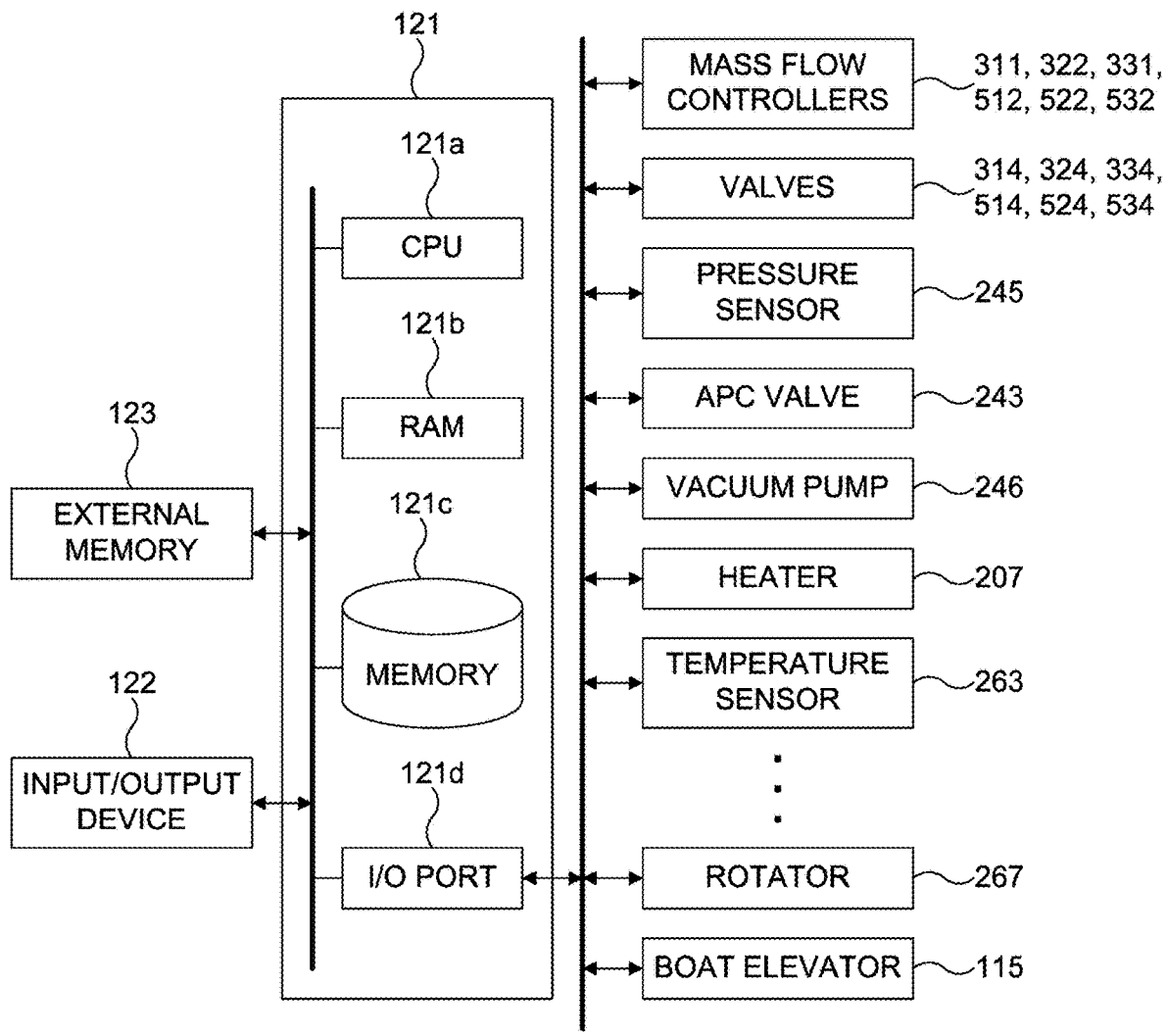
FIG. 3 is a block diagram schematically illustrating a configuration of a controller and related components of the substrate processing apparatus described herein.

As shown in FIG. 3, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus. For example, an input/output device 122 such as a touch panel is connected to the controller 121.

The memory 121c is configured by components such as a flash memory and a hard disk drive (HDD). For example, a control program configured to control the operation of the substrate processing apparatus 10 or a process recipe containing information on the sequences and conditions of a method of manufacturing a semiconductor device described later may be readably stored in the memory 121c. The process recipe is obtained by combining steps of the method of manufacturing the semiconductor device described later such that the controller 121 can execute the steps to acquire a predetermine result, and functions as a program. Hereafter, the process recipe and the control program may be collectively or individually referred to as a "program". In the present specification, the term "program" may indicate the process recipe alone, may indicate the control program alone, or may indicate a combination of the process recipe and the control program. The RAM 121b functions as a memory area (work area) where a program or data read by the CPU 121a is temporarily stored.

The I/O port 121d is connected to the above-described components such as the MFCs 311, 322, 331, 512, 522 and 532, the valves 314, 324, 334, 514, 524 and 534, the pressure sensor 245, the APC valve 243, the vacuum pump 246, the heater 207, the temperature sensor 263, the rotator 267 and the boat elevator 115. In the present specification, the term "connected" may refer to a state of being electrically directly connected, a state of electrically indirectly connected, or a state of capable of directly or indirectly transmitting and receiving an electric signal.

The CPU 121a is configured to read the control program from the memory 121c and execute the read control program. In addition, the CPU 121a is configured to read a recipe such as the process recipe from the memory 121c in accordance with an operation command inputted from the input/output device 122. According to the contents of the read recipe, the CPU 121a may be configured to control various operations such as flow rate adjusting operations for various gases by the MFCs 311, 322, 331, 512, 522 and 532, opening/closing operations of the valves 314, 324, 334, 514, 524 and 534, an opening/closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting a rotation and a rotation speed of the boat 217 by the rotator 267, an elevating and lowering operation of the boat 217 by the boat elevator 115 and an operation of transferring and accommodating the wafers 200 into the boat 217.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as a recording medium. In the present specification, the term "recording medium" may indicate the memory 121c alone, may indicate the external memory 123 alone, and may indicate both of the memory 121c and the external memory 123. Instead of the external memory 123, a communication means such as the Internet and a dedicated line may be used for providing the program to the computer.

(2) Substrate Processing

Figure 4:
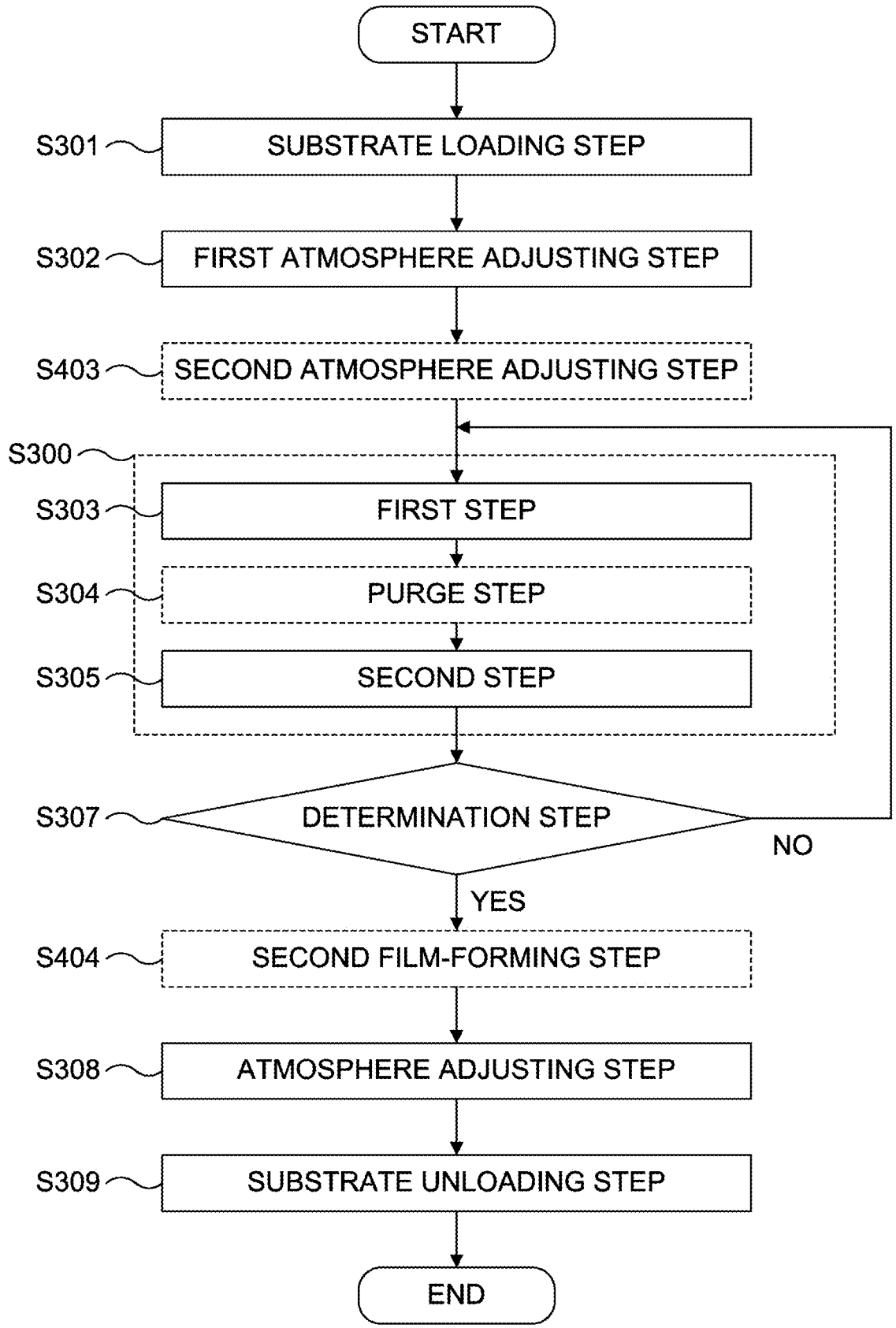
FIG. 4 is a flowchart schematically illustrating a substrate processing according to the embodiments described herein.
Figure 5:
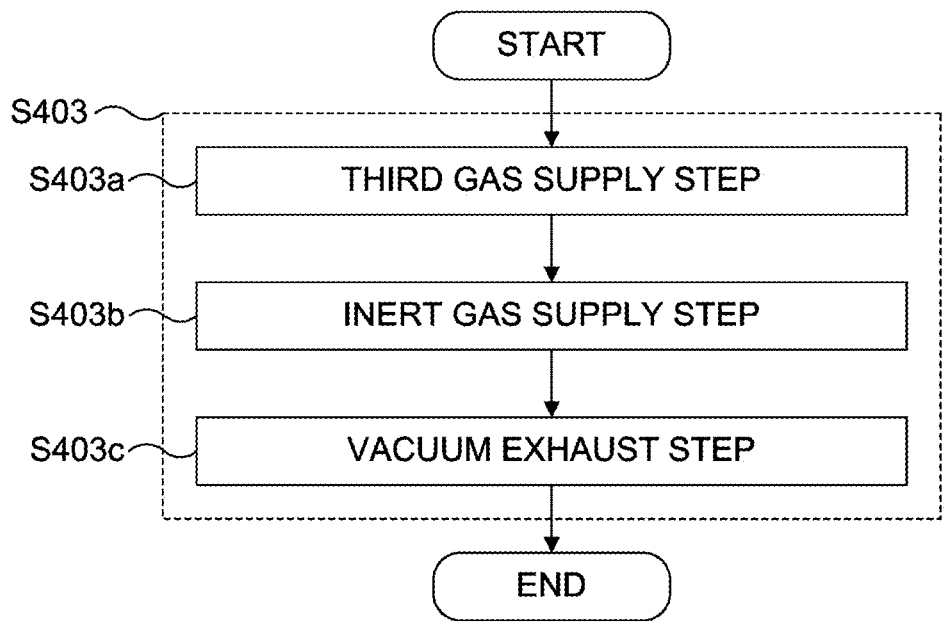
FIG. 5 is a flowchart schematically illustrating an example of a second atmosphere adjusting step of the substrate processing according to the embodiments described herein.
Figure 6:
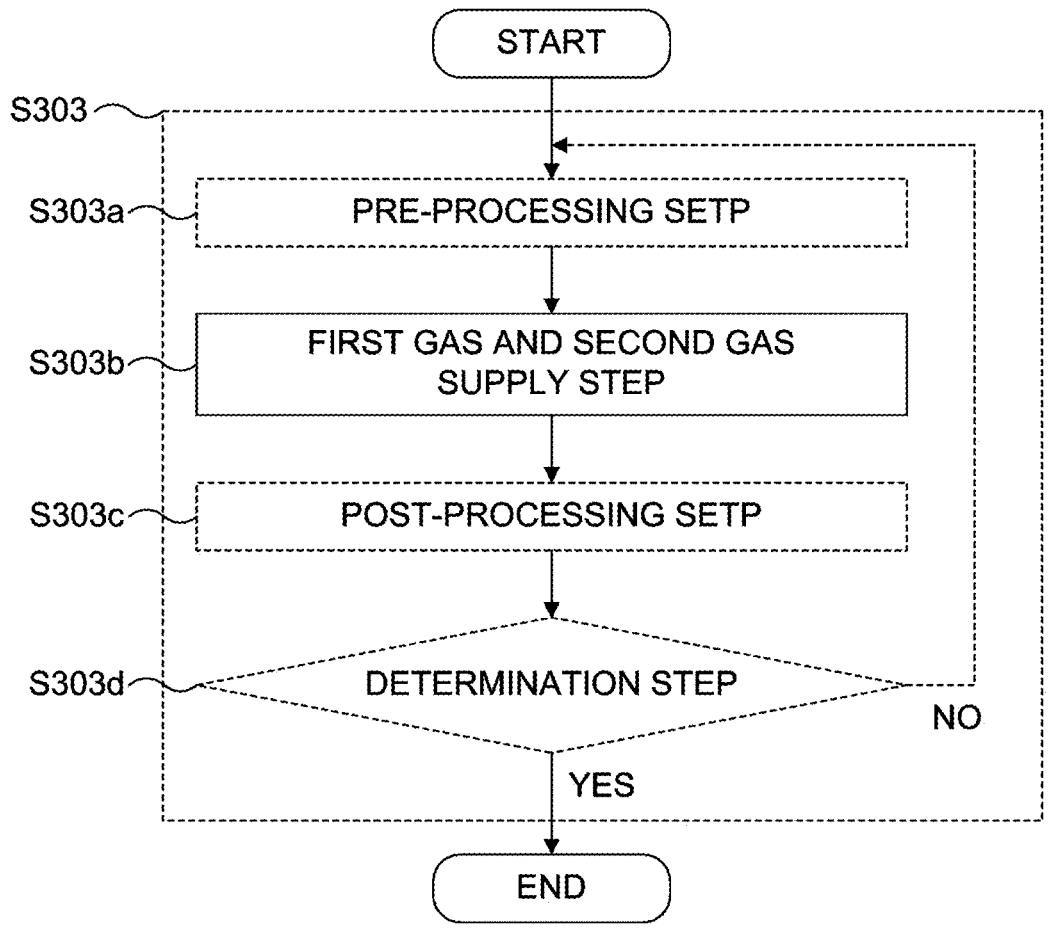
FIG. 6 is a flowchart schematically illustrating an example of a first step of the substrate processing according to the embodiments described herein.

Hereinafter, as a part of manufacturing processes of a semiconductor device, an example of a process (which is a film-forming step or a substrate processing) of forming a metal film (for example, a film constituting a gate electrode on the wafer 200) will be described with reference to FIG. 4. The substrate processing of forming the metal film is performed using the process furnace 202 of the substrate processing apparatus 10 described above. In the following description, the operations of the components constituting the substrate processing apparatus 10 are controlled by the controller 121.

Figure 12:
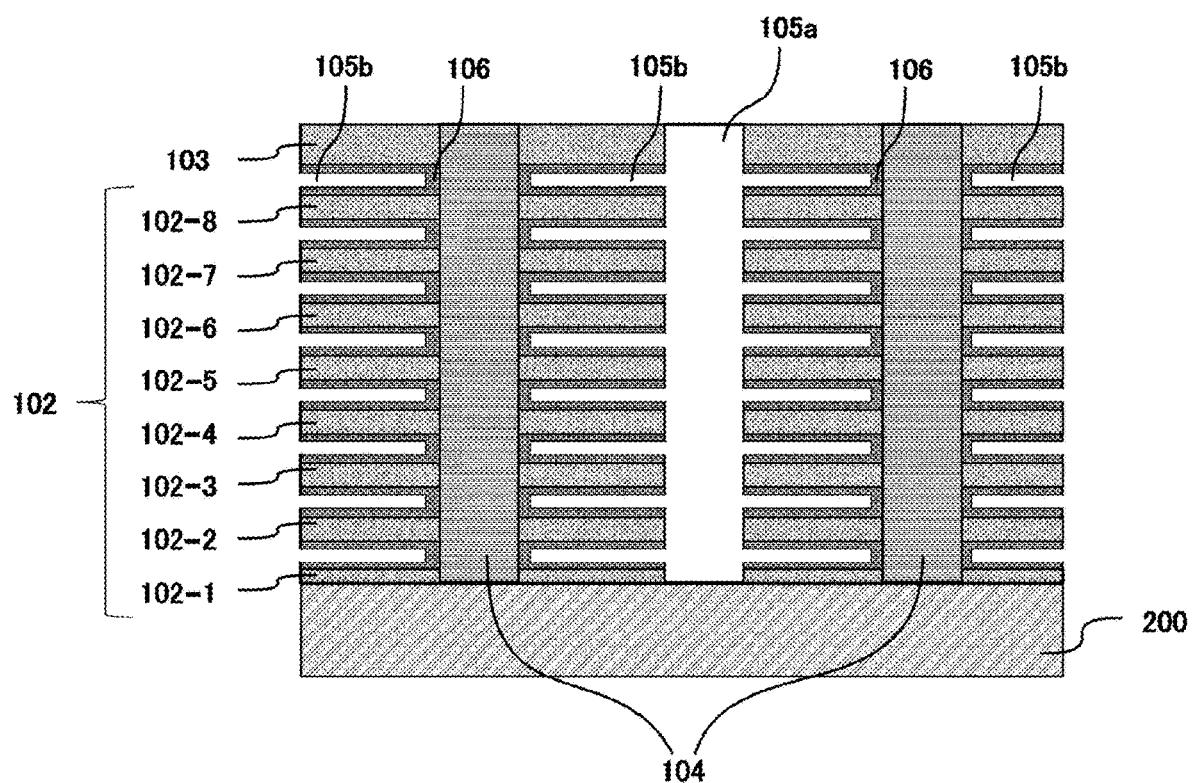
FIG. 12 is a diagram schematically illustrating a structure formed on a surface of a substrate according to the embodiments described herein.

For example, a structure shown in FIG. 12 may be formed on the wafer 200 in advance. The structure shown in FIG. 12 may be an intermediate structure of a 3D NAND memory. In the structure, a plurality of insulating films 102 may be stacked (laminated) on the wafer 200. For convenience of explanation, the present embodiments will be described by way of an example in which eight layers (that is, layers 102-1 through 102-8) are formed as the plurality of insulating films 102 stacked on the wafer 200. However, the number of layers of the insulating films 102 may be several tens to several hundreds. A structure 104 including a component such as a channel and a charge trap film is formed in the plurality of insulating films 102 stacked on the wafer 200. In addition, a hole 105a is provided in the plurality of insulating films 102 by performing an etching process. In addition, a gap 105b formed by performing the etching process is provided between every two layers of insulating films 102. An insulating film 106 is formed on an inner surface of the gap 105b. The insulating film 106 is usually made of aluminum oxide (AlO). As the wafer 200 used in the film-forming step of the present embodiments, a wafer on which the structure described above is formed may be preferably used. Therefore, in a film-forming step S300 described later, a film such as the metal film may be formed on a surface of the insulating film 106.

In the present specification, the term "wafer" may refer to "a wafer itself", may refer to "a wafer and a stacked structure (aggregated structure) of a predetermined layer (or layers) or a film (or films) formed on a surface of the wafer", or may refer to "a wafer and a structure formed on a surface of the wafer". In the present specification, the term "a surface of a wafer" may refer to "a surface of a wafer itself", may refer to "a surface of a predetermined layer or a film formed on a wafer", or may refer to "a surface of a structure formed on a surface of a wafer". In the present specification, the term "substrate" and "wafer" may be used as substantially the same meaning. That is, the term "substrate" may be substituted by "wafer" and vice versa.

In the present specification, the term "TiN film free of silicon" may refer to "a TiN film without containing silicon atoms", or may refer to "a TiN film whose silicon content is extremely low" (for example, "a TiN film containing almost no silicon atoms" or "a TiN film substantially containing no silicon atoms"). For example, the term "TiN film free of silicon" may refer to "a TiN film whose silicon content is about 4%, preferably, equal to or less than 4%".

Hereinafter, a flow and a gas supply sequence of the method of manufacturing the semiconductor device of the present embodiments will be described in detail with reference to FIGS. 4 through 9 and 11. The horizontal axis of FIG. 8 and the horizontal axis of FIG. 9 represent a time, and the vertical axis of FIG. 8 and the vertical axis of FIG. 9 represent an outline of a relationship among a supply amount of the gas such as a first gas, a second gas, a third gas and the inert gas, an opening degree of an exhaust valve such as the APC valve 243) and a pressure such as the inner pressure of the process chamber 201. The supply amount of the gas, the opening degree and the pressure are quantified in appropriate units. The supply amount of the gas in the present embodiments may refer to a flow rate of the gas, may refer to a supply time (time duration) of the gas, or may refer to both of the flow rate of the gas and the supply time of the gas.

<Substrate Loading Step S301>

The wafers 200 are charged (transferred) into the boat 217 (wafer charging). After the boat 217 is charged with the wafers 200, as shown in FIG. 1, the boat 217 charged with the wafers 200 is elevated by the boat elevator 115 and loaded (transferred) into the process chamber 201 (boat loading). With the boat 217 loaded, the seal cap 219 seals a lower end opening of the reaction tube 203 (that is, the out tube 203) via the O-ring 220b.

<First Atmosphere Adjusting Step S302>

The vacuum pump 246 vacuum-exhausts the inner atmosphere of the process chamber 201 until the inner pressure of the process chamber 201 reaches and is maintained at a desired pressure (vacuum degree). In the first atmosphere adjusting step S302, the inner pressure of the process chamber 201 is measured by the pressure sensor 245, and the APC valve 243 is feedback-controlled based on pressure information measured by the pressure sensor 245 (pressure adjusting). The vacuum pump 246 continuously vacuum-exhausts the inner atmosphere of the process chamber 201 until at least a processing of the wafer 200 is completed. The heater 207 heats the process chamber 201 until the inner temperature of the process chamber 201 reaches and is maintained at a desired temperature. In the first atmosphere adjusting step S302, the amount of the current supplied to the heater 207 is feedback-controlled based on the temperature information detected by the temperature sensor 263 such that the desired temperature distribution of the inner temperature of the process chamber 201 is obtained (temperature adjusting). The heater 207 continuously heats the process chamber 201 until at least the processing of the wafer 200 is completed. In the first atmosphere adjusting step S302, the inner pressure of the process chamber 201 is adjusted to a pressure at which the first gas is supplied in a first step S303 performed later.

<Second Atmosphere Adjusting Step S403>

Subsequently, the second atmosphere adjusting step S403 may be performed. In the second atmosphere adjusting step S403, an adjusting operation is performed to reduce an oxygen concentration in the process chamber 201. Specifically, the second atmosphere adjusting step S403 is performed according to an exemplary flow shown in FIG. 5. The flow shown in FIG. 5 includes a third gas supply step S403a, an inert gas supply step S403b and a vacuum exhaust step S403c.

<Third Gas Supply Step S403a>

In the third gas supply step S403a, firstly, the valve 334 is opened to supply the third gas such as the $NH_3$ gas serving as an atmosphere adjusting gas into the gas supply pipe 330. The $NH_3$ gas also serves as a gas containing nitrogen and hydrogen. The $NH_3$ gas is supplied through the second flash tank 332 into the process chamber 201 via the plurality of gas supply holes 430a of the nozzle 430, and is exhausted through the exhaust pipe 231. In parallel with supplying the $NH_3$ gas, in order to prevent the $NH_3$ gas from entering the nozzles 410 and 420, the valves 514 and 524 may be opened to supply the $N_2$ gas into the gas supply pipes 510 and 520. The $N_2$ gas is supplied into the process chamber 201 through the gas supply pipes 310 and 320 and the nozzles 410 and 420, and is exhausted through the exhaust pipe 231. In the third gas supply step S403a, the $NH_3$ gas whose flow rate is adjusted by the MFC 331 is supplied into the second flash tank 332, and a predetermined amount of the $NH_3$ gas is stored in the second flash tank 332. The $NH_3$ gas may be stored in the second flash tank 332 while the substrate processing apparatus 10 is idling or while the gas other than the $NH_3$ gas is being supplied.

In the third gas supply step S403a, for example, the APC valve 243 is appropriately adjusted (controlled) to adjust the inner pressure of the process chamber 201 to a pressure ranging from 1 Pa to 3,990 Pa. For example, a supply flow rate of the $NH_3$ gas controlled by the MFC 331 may be set to a flow rate ranging from 0.1 slm to 30 slm. For example, supply flow rates of the $N_2$ gas controlled by the MFCs 512, 522 and 532 may be set to be within a range from 0.1 slm to 30 slm, respectively. For example, a supply time (time duration) of supplying the $NH_3$ gas to the wafer 200 may be set to a time duration ranging from 0.01 second to 30 seconds. After the supply time of the $NH_3$ gas has elapsed, the valve 334 is closed.

By supplying the $NH_3$ gas serving as a reducing gas, into the process chamber 201, it is possible to obtain at least one among the following effects (a) and (b).

(a) It is possible to remove a substance such as a residual oxygen (O), an organic substance and an excessive moisture (OH) adsorbed on the process chamber 201 and a surface of the wafer 200.

(b) The characteristics of a titanium-containing layer formed on the wafer 200 may be different when a supply state of the $TiCl_4$ gas supplied in a first stage in a first cycle of the film-forming step S300 (that is, when the $TiCl_4$ gas is supplied once in a first gas and a second gas supply step S303b described later during performing the film-forming step S300 once), the supply state of the $TiCl_4$ gas supplied in or after a second stage of the first cycle of the film-forming step S300 (that is, when the $TiCl_4$ gas is supplied twice or more in the first gas and the second gas supply step S303b during performing the film-forming step S300 once), and the supply state of the $TiCl_4$ gas supplied in or after a second cycle of the film-forming step S300 (that is, during performing the film-forming step S300 twice or more) are different. However, by supplying the NH$_3$ gas, it is possible to prevent the characteristics of the titanium-containing layer formed on the wafer 200 from being different for each stage or each cycle.

<Inert Gas Supply Step S403b>

In the inert gas supply step S403b, the N$_2$ gas serving as the inert gas is introduced into the process chamber 201 through the nozzles 410, 420 and 430. Thereby, a purge process of pushing out the NH$_3$ gas and by-products in the process chamber 201 into the exhaust pipe 231 is performed. Flow rates of the N$_2$ gas supplied into the nozzles 410, 420 and 430 are adjusted by MFCs 512, 522 and 532, respectively. For example, the flow rate of the N$_2$ gas may be adjusted to flow rates ranging from 0.1 slm to 20 slm, respectively.

<Vacuum Exhaust Step S403c>

In the vacuum exhaust step S403c, the inner atmosphere of the process chamber 201 is exhausted to adjust the inner pressure of the process chamber 201. In the vacuum exhaust step S403c, the inner pressure of the process chamber 201 is adjusted to the pressure at which the first gas is supplied in the first step S303 performed later. In the vacuum exhaust step S403c, the flow rates of the inert gas are controlled by the MFCs 512, 522 and 532, respectively. For example, the flow rate of the inert gas may be set to flow rates ranging from 0.01 slm to 1 slm, preferably from 0.1 slm to 1 slm, respectively. In the vacuum exhaust step S403c, by adjusting the inner pressure of the process chamber 201 to the pressure at which the first gas is supplied in the first step S303 performed later, it is possible to suppress a pressure fluctuation when supplying the first gas, and it is also possible to uniformly supply the first gas to the surface of the wafer 200.

<Film-Formation Step S300>

Subsequently, the film-forming step S300 is performed. The film-forming step S300 includes at least the first step S303 and a second step S305 described below. Each step of the film-forming step S300 will be described with reference to FIGS. 4 and 6 through 9.

<First Step S303>

The first step S303 includes at least the first gas and the second gas supply step S303b. As shown by a broken line in FIG. 6, a pre-processing step S303a may be performed before the first gas and the second gas supply step S303b. In addition, as shown by another broken line in FIG. 6, a post-processing step S303c may be performed after the first gas and the second gas supply step S303b. In addition, a determination step S303d may be performed after the first gas and the second gas supply step S303b or after the post-processing step S303c. Each step of the first step S303 will be described below.

<Pre-Processing Step S303a>

In the pre-processing step S303a, the supply of the inert gas and the exhaust of the inert gas are continuously performed.

In the pre-processing step S303a, the N$_2$ gas serving as the inert gas is supplied into the process chamber 201 to adjust the inner pressure of the process chamber 201. For example, the flow rate of the N$_2$ gas may be adjusted to a flow rate ranging from 0.1 slm to 5 slm, preferably from 0.3 slm to 3 slm, and more preferably from 0.5 slm to 2 slm. When supplying the N$_2$ gas in the pre-processing step S303a, the inner pressure of the process chamber 201 is adjusted to the pressure at which the first gas is supplied in the first step S303 performed later. For example, the inner pressure of the process chamber 201 is adjusted to a pressure ranging from 1 Pa to 3,990 Pa. Specifically, the inner pressure of the process chamber 201 may be set to 900 Pa. For example, a supply time (time duration) of supplying the N$_2$ gas into the process chamber 201 may be set to a time duration "T1" (shown in FIG. 8) ranging from 1 second to 10 seconds. Specifically, the time duration T1 may be set to 7 seconds.

After supplying the N$_2$ gas for a predetermined time (that is, the time duration T1), the supply of the N$_2$ gas is stopped or the flow rate of the N$_2$ gas is reduced. The N$_2$ gas may be supplied through the entirety of the nozzles existing in the process chamber 201, or may be supplied through one of the nozzles existing in the process chamber 201. Further, the N$_2$ gas may be supplied through a nozzle other than a nozzle used in the subsequent step. In addition, a state where the supply of the N$_2$ gas is stopped or the flow rate of the N$_2$ gas is reduced may be maintained for a predetermined time ("T2" shown in FIG. 8). The flow rates of the inert gas are adjusted by MFCs 512, 522 and 532, respectively. For example, the flow rates of the inert gas may be adjusted to flow rates ranging from 0.01 slm to 1 slm, preferably from 0.1 slm to 1 slm, respectively. In the pre-processing step S303a, for example, the predetermined time T2 may be set to a time duration ranging from 1 second to 10 seconds. Specifically, the predetermined time T2 may be set to 5 seconds. By maintaining the state where the supply of the N$_2$ gas is stopped or the flow rate of the N$_2$ gas is reduced for the predetermined time T2, it is possible to converge an amount of the pressure fluctuation in the process chamber 201 to some extent. In the pre-processing step S303a, it is preferable that T1 is greater than T2.

<First Gas and Second Gas Supply Step S303b>

In the first gas and the second gas supply step S303b, the TiCl$_4$ gas serving as the first gas is supplied in a first gas supply step, and after a predetermined time has elapsed, the SiH$_4$ gas serving as the second gas is supplied in a second gas supply step.

<First Gas Supply Step>

In the first gas supply step of the first gas and the second gas supply step S303b, the valve 314 is opened to supply the TiCl$_4$ gas serving as the first gas (source gas) into the gas supply pipe 310. The TiCl$_4$ gas is supplied into the process chamber 201 through the first flash tank 312 and the plurality of gas supply holes 410a of the nozzle 410, and is exhausted through the exhaust pipe 231. Thereby, the TiCl$_4$ gas is supplied to the wafer 200. When supplying the TiCl$_4$ gas, simultaneously, the valve 514 is opened to supply the inert gas such as the N$_2$ gas into the gas supply pipe 510. The flow rate of the N$_2$ gas supplied into the gas supply pipe 510 is adjusted by the MFC 512. The N$_2$ gas whose flow rate is adjusted is then supplied into the process chamber 201 together with the TiCl$_4$ gas, and is exhausted through the exhaust pipe 231. In the first gas supply step, in order to prevent the TiCl$_4$ gas from entering the nozzles 420 and 430, the valves 524 and 534 may be opened to supply the N$_2$ gas into the gas supply pipes 520 and 530. The N$_2$ gas is supplied into the process chamber 201 through the gas supply pipes 320 and 330 and the nozzles 420 and 430, and is exhausted through the exhaust pipe 231. The gas (that is, the TiCl$_4$ gas) may be stored in the first flash tank 312 while the substrate processing apparatus 10 is idling or while the gas other than the TiCl$_4$ gas is being supplied.

In the first gas supply step, for example, the APC valve 243 is appropriately adjusted (controlled) to adjust the inner pressure of the process chamber 201 to a pressure ranging from 1 Pa to 3,990 Pa. Specifically, the inner pressure of the process chamber 201 may be set to 900 Pa. For example, a supply flow rate of the TiCl$_4$ gas controlled by the MFC 311 may be set to a flow rate ranging from 0.1 slm to 2 slm. Specifically, the supply flow rate of the TiCl$_4$ gas may be set to 0.9 slm. For example, the supply flow rates of the N$_2$ gas controlled by the MFCs 512, 522 and 532 may be set to be within a range from 0.1 slm to 20 slm, respectively. In the first gas supply step, for example, the opening degree of the APC valve 243 may be controlled to an opening degree ranging from 5% to 30%, preferably from 8% to 12%. In the first gas supply step, for example, the temperature of the heater 207 may be set such that the temperature of the wafer 200 reaches and is maintained at a temperature ranging from 300° C. to 600° C.

In the first gas supply step, the TiCl$_4$ gas and the N$_2$ gas are supplied into the process chamber 201 without any other gas being supplied into the process chamber 201 together with the TiCl$_4$ gas and the N$_2$ gas. By supplying the TiCl$_4$ gas, the titanium-containing layer is formed on the wafer 200 (that is, on a base film on the surface of the wafer 200). The titanium-containing layer may refer to a titanium layer containing chlorine (Cl), may refer to an adsorption layer of the TiCl$_4$, or may refer to both of the titanium layer containing chlorine and the adsorption layer of the TiCl$_4$. A supply time (time duration) of supplying the TiCl$_4$ gas and the N$_2$ gas may be set to a predetermined time (that is, a time duration obtained by subtracting "T4" from "T3" shown in FIG. 8).

The TiCl$_4$ gas supplied in the first gas supply step reacts with the gas existing in the process chamber 201 and the substance existing on the wafer 200 to generate hydrogen chloride (HCl), which is a growth inhibitor. The gas existing in the process chamber 201 and the substance existing on the wafer 200 may be considered as a residual NH$_3$. That is, the HCl is generated by the reaction of the residual NH$_3$ and the TiCl$_4$ gas. There may occur a problem that the HCl reduces a uniformity of the TiN film on the surface of the wafer 200 or a uniformity of the TiN film formed in the hole 105a or the gap 105b of the structure formed on the wafer 200. In addition, when the third gas supply step S403a is performed, there may also occur a problem that the HCl is generated from a first cycle (that is, during performing the first gas supply step of the first gas and the second gas supply step S303b once).

<Second Gas Supply Step>

After a predetermined time has elapsed from the supply of the TiCl$_4$ gas, in the second gas supply step of the first gas and the second gas supply step S303b, the valve 324 is opened to supply the SiH$_4$ gas serving as the second gas (reducing gas) into the gas supply pipe 320. In the second gas supply step, for example, the predetermined time may refer to a time ranging from 0.01 second to 5 seconds. Specifically, the predetermined time may be set to 1 second. A flow rate of the SiH$_4$ gas is adjusted by the MFC 322. The SiH$_4$ gas whose flow rate is adjusted is then supplied into the process chamber 201 through the plurality of gas supply holes 420a of the nozzle 420, and is exhausted through the exhaust pipe 231. When supplying the SiH$_4$ gas, simultaneously, the valve 524 is opened to supply the inert gas such as the N$_2$ gas into the gas supply pipe 520. The flow rate of the N$_2$ gas supplied into the gas supply pipe 520 is adjusted by the MFC 522. The N$_2$ gas whose flow rate is adjusted is then supplied into the process chamber 201 together with the SiH$_4$ gas, and is exhausted through the exhaust pipe 231. In the second gas supply step, in order to prevent the TiCl$_4$ gas and the SiH$_4$ gas from entering the nozzle 430, the valve 534 may be opened to supply the N$_2$ gas into the gas supply pipe 530. The N$_2$ gas is supplied into the process chamber 201 through the gas supply pipe 330 and the nozzle 430, and is exhausted through the exhaust pipe 231. Thereby, the TiCl$_4$ gas, the SiH$_4$ gas, and the N$_2$ gas are supplied to the wafer 200 in parallel. That is, the TiCl$_4$ gas and the SiH$_4$ gas are supplied in parallel for at least a time duration. The time duration in which the TiCl$_4$ gas and the SiH$_4$ gas are supplied in parallel is referred to as "T4" shown in FIG. 8. According to the present embodiments, it is preferable that T3 is greater than T4. With such a configuration, it is possible to suppress the adsorption of silicon on the surface of the wafer 200. In the second gas supply step, for example, the opening degree of the APC valve 243 may be controlled to an opening degree ranging from 5% to 40%, preferably from 8% to 12% so as to maintain the pressure same as that in the time duration in which the TiCl$_4$ gas is supplied. Therefore, the opening degree of the APC valve 243 in the second gas supply step is set to be greater than the opening degree of the APC valve 243 when the TiCl$_4$ gas is supplied.

By supplying the SiH$_4$ gas, it is possible to reduce and remove the HCl serving as the growth inhibitor. In the second gas supply step, it is presumed that the following reaction occurs. For example, a reaction of "4HCl+SiH$_4$→SiCl$_4$+4H$_2$" may occur. A vapor pressure of the substance generated in the reaction described above is high. Therefore, the substance generated in the reaction described above is exhausted through the exhaust pipe 231 without being adsorbed on the process chamber 201 or the wafer 200.

In the second gas supply step, for example, the APC valve 243 is appropriately adjusted (controlled) to adjust the inner pressure of the process chamber 201 to a pressure ranging from 130 Pa to 3,990 Pa, preferably from 500 Pa to 2,660 Pa, and more preferably from 600 Pa to 1,500 Pa. In addition, preferably, the inner pressure of the process chamber 201 is maintained to the pressure same as that in the time duration in which the TiCl$_4$ gas is supplied. Specifically, the inner pressure of the process chamber 201 may be set to 900 Pa. The pressure to be maintained in the second gas supply step may change in a variable pressure range depending on conditions such as the configuration of the substrate processing apparatus 10, an environment in the process chamber 201, a surface condition of the wafer 200 to be processed and the number of the wafers 200. According to the present embodiments, a pressure range of +20% may be allowed as the pressure during the time duration in which the TiCl$_4$ gas is supplied. Regarding the pressure range, when the inner pressure of the process chamber 201 is lower than 130 Pa, silicon contained in the SiH$_4$ gas may enter the titanium-containing layer. Thus, a silicon concentration in the TiN film to be formed may become high. As a result, a titanium silicon nitride film (also simply referred to as a "TiSiN film") may be formed instead of the TiN film. Similarly, when the inner pressure of the process chamber 201 is greater than 3,990 Pa, silicon contained in the SiH$_4$ gas may enter the titanium-containing layer. Thus, the silicon concentration in the TiN film to be formed may become high. As a result, the TiSiN film may be formed instead of the TiN film. As described above, when the inner pressure of the process chamber 201 is too low or too high, an elemental composition of the film to be formed may change. However, by suppressing the pressure fluctuation, it is possible to uniformly form the titanium-containing layer on the surface of the structure formed on the wafer 200. A supply flow rate of the SiH$_4$ gas controlled by the MFC 322 may be set to be equal to or higher than the flow rate of the TiCl$_4$ gas. For example, the supply flow rate of the SiH$_4$ gas may be set to a flow rate ranging from 0.1 slm to 5 slm, preferably from 0.3 slm to 3 slm, and more preferably from 0.5 slm to 2 slm. Specifically, the supply flow rate of the $SiH_4$ gas may be set to 1 slm. For example, the supply flow rates of the $N_2$ gas controlled by the MFC 512, 522 and 532 may be set to be within a range from 0.01 slm to 20 slm, preferably from 0.1 slm to 10 slm, and more preferably from 0.1 slm to 1 slm, respectively. In the second gas supply step, the temperature of the heater 207 may be set to the same temperature as that of the first gas supply step.

In addition, by supplying the $TiCl_4$ gas using the first flash tank 312 and supplying the $SiH_4$ gas without using a flash tank, it is possible to supply the $TiCl_4$ gas to most of the surface of the wafer 200 and the surface of the structure (in particular, the hole 105*a* and the gap 105*b*) described above. The $SiH_4$ gas supplied as described above may greatly contribute to the capture of the HCl floating in the inner atmosphere of the process chamber 201. That is, it is possible to remove the substance such as the HCl, $SiH_4$, $SiCl_4$ and $H_2$ while adsorbing $TiCl_4$.

After a predetermined time (for example, 0.01 second to 60 seconds, preferably 0.1 second to 30 seconds, and more preferably 1 second to 20 seconds) has elapsed from the supply of the $SiH_4$ gas, the valve 324 is closed to stop the supply of the $SiH_4$ gas. Specifically, the $SiH_4$ gas may be supplied for 4 seconds. That is, for example, the time duration of supplying the $SiH_4$ gas to the wafer 200 may be a time duration ranging from 0.01 second to 60 seconds, preferably from 0.1 second to 30 seconds, and more preferably from 1 second to 20 seconds. When the time duration of supplying the $SiH_4$ gas to the wafer 200 is shorter than 0.01 seconds, the HCl serving as the growth inhibitor may not be sufficiently reduced by the $SiH_4$ gas and may remain in the titanium-containing layer. When the time duration of supplying the $SiH_4$ gas to the wafer 200 is longer than 60 seconds, silicon contained in the $SiH_4$ gas may enter the titanium-containing layer. Thus, the silicon concentration in the TiN film to be formed may become high. As a result, the TiSiN film may be formed instead of the TiN film. Further, when the supply of the $SiH_4$ gas is repeatedly performed a plurality of times, it is preferable to suppress the supply time of the $SiH_4$ gas in order to suppress an increase in the silicon concentration in the film. However, when the supply of the $SiH_4$ gas is stopped before the supply of the $TiCl_4$ gas is stopped, the HCl may not be sufficiently reduced by the $SiH_4$ gas and may remain. Specifically, as shown in FIG. 8, the supply of the $SiH_4$ gas and the supply of $TiCl_4$ gas may be stopped simultaneously. The HCl serving a reaction inhibitor (by-products) may remain in the process chamber 201 and on the wafer 200 when the supply of the $SiH_4$ gas is stopped before the supply of the $TiCl_4$ gas is stopped as shown in FIG. 9. Therefore, it is preferable that the supply of the $SiH_4$ gas and the supply of the $TiCl_4$ gas may be stopped simultaneously as shown in FIG. 8.

After a predetermined time (for example, 0.01 second to 60 seconds, preferably 0.1 second to 30 seconds, and more preferably 1 second to 20 seconds) has elapsed from the supply of the $TiCl_4$ gas, the valve 314 of the gas supply pipe 310 is closed to stop the supply of the $TiCl_4$ gas. Specifically, the $TiCl_4$ gas may be supplied for 5 seconds. That is, for example, the time duration of supplying the $TiCl_4$ gas to the wafer 200 may be a time duration ranging from 0.01 second to 10 seconds.

<Post-Processing Step S303*c*>

In the post-processing step S303*c*, a process of removing the first gas, the second gas and the by-products remaining in the process chamber 201 is performed. Specifically, a step of supplying the inert gas and a step of exhausting the inert gas are performed. In the step of supplying the inert gas, the $N_2$ gas serving as the inert gas is supplied into the process chamber 201. In the step of supplying the inert gas, the flow rate of the $N_2$ gas is set to be greater than the flow rate of the $N_2$ gas in the first gas and the second gas supply step S303*b*. After a predetermined time ("T5" shown in FIG. 8) (for example, after 0.01 second to 10 seconds, specifically, after 2 seconds), has elapsed from the supply of the $N_2$ gas, the flow rate of the $N_2$ gas is reduced or the valve through which the $N_2$ gas is supplied is closed. In the step of supplying the inert gas, the opening degree of the APC valve 243 may be set to 20% to 100%. Preferably, the opening degree of the APC valve 243 may be set to about 50%. By adjusting the opening degree of the APC valve 243 as described above, it is possible to suppress sudden pressure fluctuations. As a result, it is possible to remove the substance such as the gas remaining in the process chamber 201.

Subsequently, after the supply of the $N_2$ gas is stopped, in the step of exhausting the inert gas, the inner atmosphere of the process chamber 201 is vacuum-exhausted for a predetermined time ("T6" shown in FIG. 8) so as to remove a residual gas in the process chamber 201. In the step of exhausting the inert gas, the inner atmosphere of the process chamber 201 is vacuum-exhausted such that the inner pressure of the process chamber 201 is equal to or lower than 100 Pa. In the step of exhausting the inert gas, the opening degree of the APC valve 243 may be maintained to be the same as the opening degree of the APC valve 243 when the $N_2$ gas is supplied (that is, the opening degree of the APC valve 243 in the step of supplying the inert gas).

<Determination Step S303*d*>

In the determination step S303*d*, the controller 121 determines whether a cycle of the first step S303 including at least the first gas and the second gas supply step S303*b* is performed a predetermined number of times (X times). When the controller 121 determines, in the determination step S303*d*, that the cycle of the first step S303 is performed the predetermined number of times ("YES" in FIG. 6), the first step S303 is terminated. When the controller 121 determines, in the determination step S303*d*, that the cycle of the first step S303 is not performed the predetermined number of times ("NO" in FIG. 6), the cycle of the first step S303 (that is at least the first gas and the second gas supply step S303*b*) is repeatedly performed until the cycle of the first step S303 is performed the predetermined number of times. In the determination step S303*d*, for example, the predetermined number of times (X times) may be set to a number of times ranging from twice to 30 times, preferably from 10 times to 20 times, and more preferably from 15 times to 20 times. By increasing the predetermined number of times (X times), it is possible to improve the uniformity on the surface of the wafer 200 or to improve a coverage (covering ratio) on the surface of the structure described above. On the other hand, a film-forming rate with respect to the predetermined number of times (X times) is represented by a saturation curve (not shown). This phenomenon is considered to be caused by a decrease in the number of adsorption sites of the $TiCl_4$ on the wafer 200, an occurrence of the steric hindrance due to the adsorbed $TiCl_4$ and an increase in an amount of the by-products generated. Therefore, even when the predetermined number of times (X times) is increased, it does not contribute to the film-forming rate and causes a decrease in the throughput. Therefore, it is preferable to set the predetermined number of times (X times) in such a range described above.

When the predetermined number of times (X times) is increased, for example, to 20 times or more, the time durations T3 and T4 when performing, for example, the 11th or later cycle of the first step S303 may be set to be shorter than the time durations T3 and T4 when performing the 10th or earlier cycle of the first step S303. As the predetermined number of times (X times) is increased, the number of the adsorption sites of the $TiCl_4$ on the wafer 200 tends to decrease and saturate, and the amount of the by-products generated tends to increase. Therefore, an amount of the gas contributing to the formation of the film may decrease. Therefore, for example, the supply times of the first gas and the second gas may be shortened when performing the 11th or later cycle of the first step S303.

It is preferable to perform the pre-processing step S303a described above when performing the second or later cycle of the first step S303. In the pre-processing step S303a, the HCl and the $SiH_4$ generated when performing the first cycle of the first step S303 may be removed.

In addition, in the post-processing step S303c described above, it is preferable to remove the gas remaining in the process chamber 201 as much as possible in order to promote the adsorption of the $TiCl_4$ gas when performing the second or later cycle of the first step S303 twice or more. In the first step S303, the post-processing step S303c may serve as a purge process using the pressure fluctuation. Therefore, the time duration "T5+T6" of the post-processing step S303c may be set to be longer than the time duration "T1+T2" of the pre-processing step S303a depending on the processing content of the first step S303. With such a configuration, it is possible to promote the adsorption of the $TiCl_4$ within the predetermined time duration of the first step S303.

<Purge Step S304>

The purge step S304 may be performed after the first step S303 and before the second step S305. Since the purge step S304 according to the present embodiments is performed in a similar manner to obtain the substantially the same effect as the second atmosphere adjusting step S403 and the post-processing step S303c described above, the description thereof will be omitted.

<Second Step S305>

Figure 7:
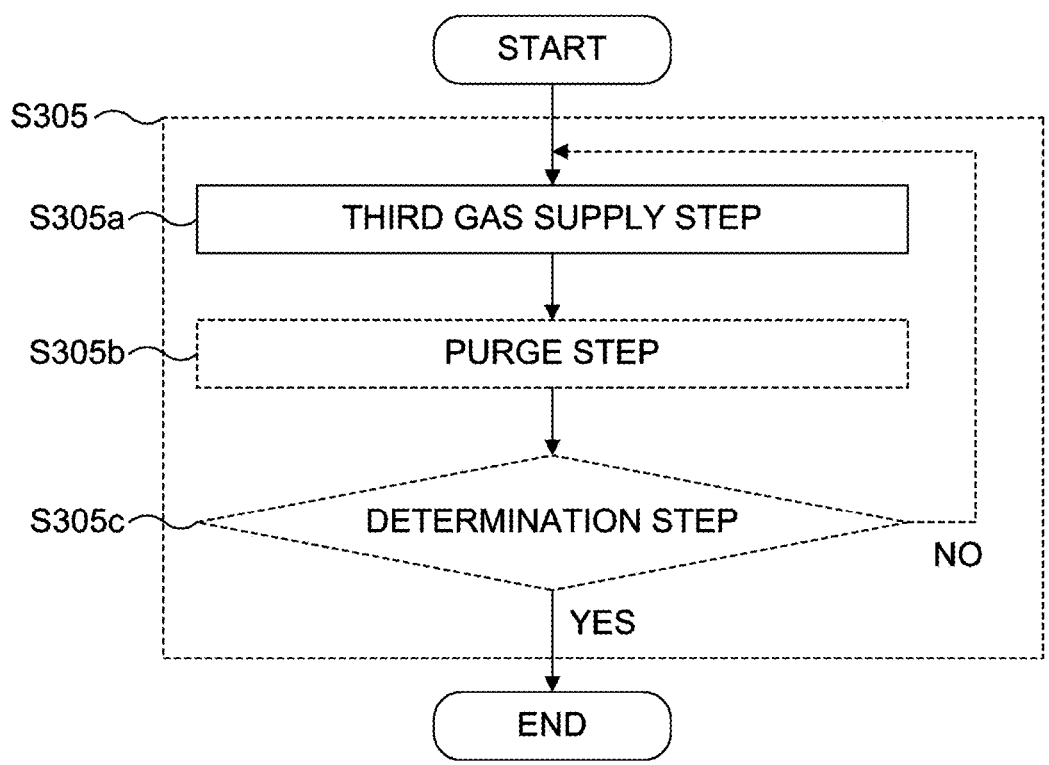
FIG. 7 is a flowchart schematically illustrating an example of a second step of the substrate processing according to the embodiments described herein.
Figure 8:
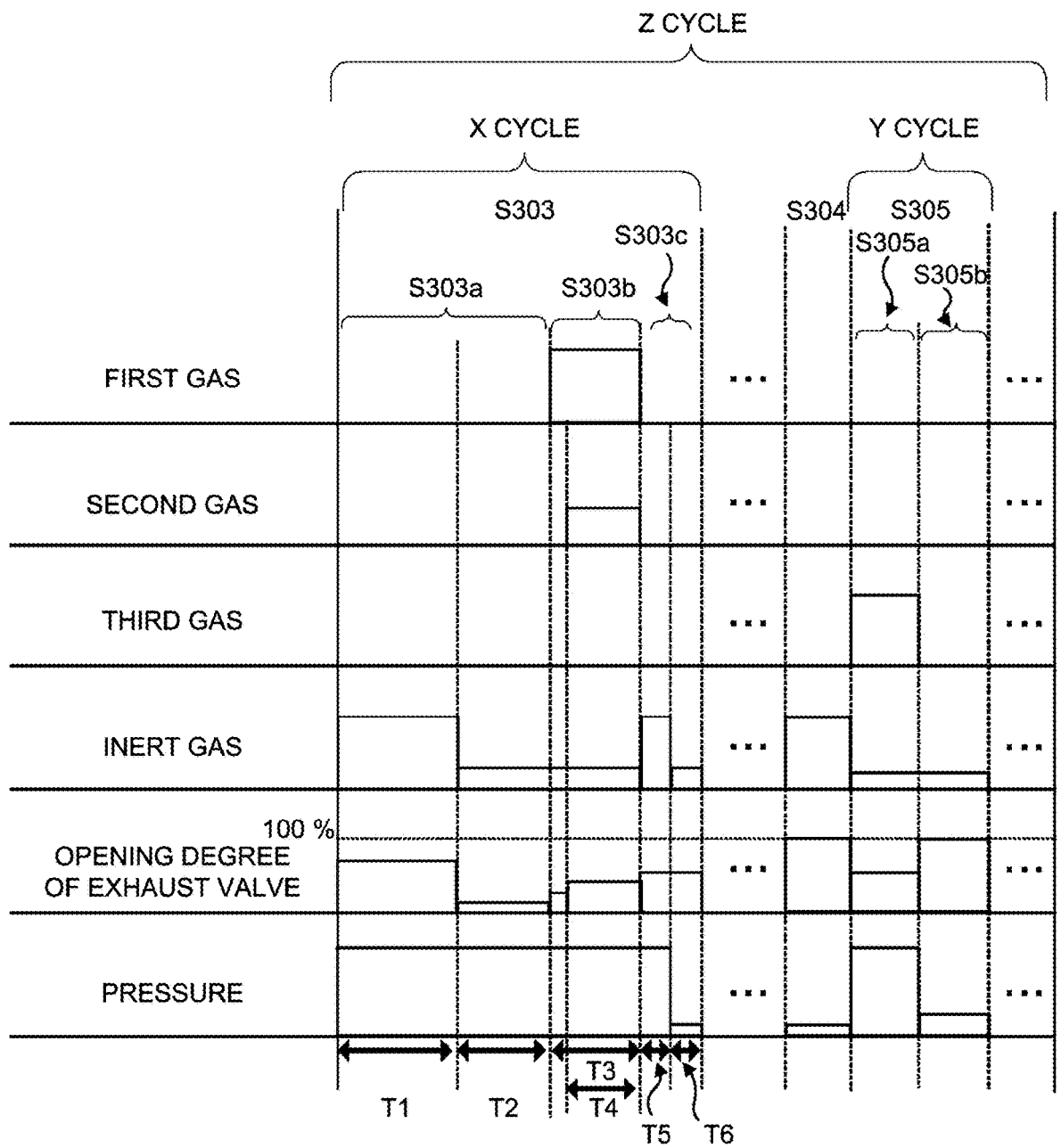
FIG. 8 is a timing diagram schematically illustrating an example of a gas supply used in the substrate processing according to the embodiments described herein.
Figure 9:
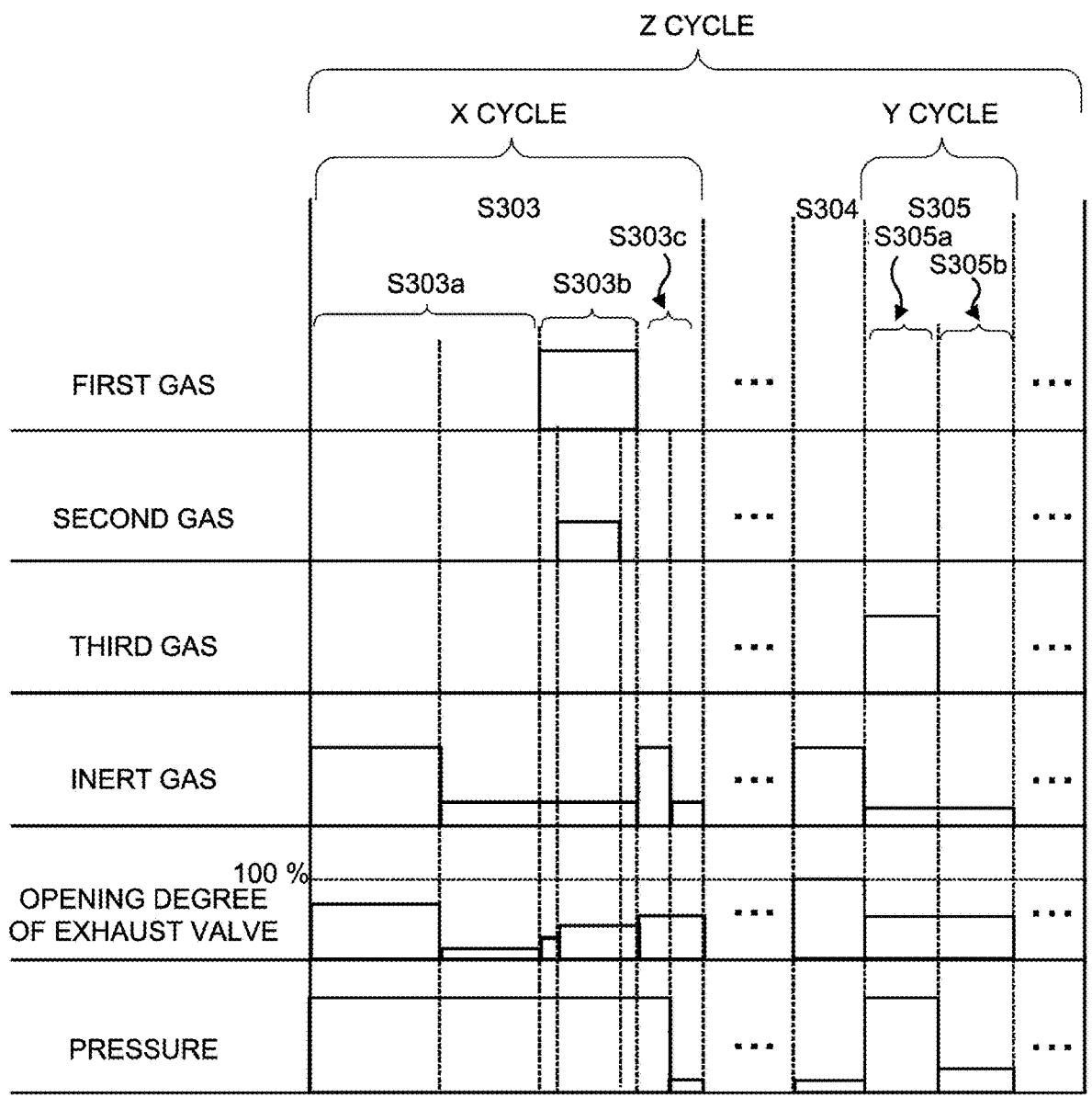
FIG. 9 is a timing diagram schematically illustrating another example of the gas supply used in the substrate processing according to the embodiments described herein.

As shown in FIGS. 7, 8 and 9, the second step S305 includes at least a third gas supply step S305a. As shown by a broken line in FIG. 7, the second step S305 may further include a purge step S305b or a determination step S305c. Each step of the second step S305 will be described below.

<Third Gas Supply Step S305a: $NH_3$ Gas Supply>

In the third gas supply step S305a, the valve 334 is opened to supply the third gas such as the $NH_3$ gas serving as the reactive gas into the gas supply pipe 330. The $NH_3$ gas is supplied through the second flash tank 332 into the process chamber 201 via the plurality of gas supply holes 430a of the nozzle 430, and is exhausted through the exhaust pipe 231. Thereby, the $NH_3$ gas is supplied to the wafer 200. When supplying the $NH_3$ gas, simultaneously, the valve 534 is opened to supply the inert gas such as the $N_2$ gas into the gas supply pipe 530. The flow rate of the $N_2$ gas supplied into the gas supply pipe 530 is adjusted by the MFC 532. The $N_2$ gas whose flow rate is adjusted is then supplied into the process chamber 201 together with the $NH_3$ gas, and is exhausted through the exhaust pipe 231. In parallel with supplying the $NH_3$ gas, in order to prevent the $NH_3$ gas from entering the nozzles 410 and 420, the valves 514 and 524 may be opened to supply the $N_2$ gas into the gas supply pipes 510 and 520. The $N_2$ gas is supplied into the process chamber 201 through the gas supply pipes 310 and 320 and the nozzles 410 and 420, and is exhausted through the exhaust pipe 231. In the third gas supply step S305a, the $NH_3$ gas may be stored in the second flash tank 332 while the substrate processing apparatus 10 is idling or while the gas other than the $NH_3$ gas is being supplied.

In the third gas supply step S305a, for example, the APC valve 243 is appropriately adjusted (controlled) to adjust the inner pressure of the process chamber 201 to a pressure ranging from 1 Pa to 3,990 Pa. For example, the supply flow rate of the $NH_3$ gas controlled by the MFC 331 may be set to a flow rate ranging from 0.1 slm to 30 slm. For example, the supply flow rates of the $N_2$ gas controlled by the MFCs 512, 522 and 532 may be set to be within a range from 0.1 slm to 30 slm, respectively. For example, the supply time (time duration) of supplying the $NH_3$ gas to the wafer 200 may be set to a time duration ranging from 0.01 second to 30 seconds. In the third gas supply step S305a, the temperature of the heater 207 may be set to the same temperature as that of the first step S303.

In the third gas supply step S305a, the $NH_3$ gas and the $N_2$ gas are supplied into the process chamber 201 without any other gas being supplied into the process chamber 201 together with the $NH_3$ gas and the $N_2$ gas. In the third gas supply step S305a, a substitution reaction occurs between the $NH_3$ gas and at least a portion of the titanium-containing layer formed on the wafer 200 in the first step S303. During the substitution reaction, titanium (Ti) contained in the titanium-containing layer and nitrogen (N) contained in the $NH_3$ gas are bonded. As a result, a titanium nitride layer (also simply referred to as a "TiN layer") containing titanium and nitrogen and containing substantially no silicon is formed on the wafer 200. As by-products of the substitution reaction, ammonium chloride ($NH_4Cl$) is formed.

<Purge Step S305b: Residual Gas Removing Step>

After the TiN layer is formed, the valve 334 is closed to stop the supply of the $NH_3$ gas. Then, a residual gas in the process chamber 201 such as the $NH_3$ gas which did not react or which contributed to the formation of the TiN layer or the by-products ($NH_4Cl$) is removed from the process chamber 201. In the purge step S305b, each MFC and the APC valve 243 are appropriately controlled. Specifically, the opening degree of the APC valve 243 in the purge step S305b may be set such that the APC valve 243 is approximately fully open (that is, the opening degree of the APC valve 243 is approximately 100%) by controlling the APC valve 243. Further, a total flow rate of the $N_2$ gas may be set to a flow rate ranging from 1 slm to 100 slm by controlling each MFC. Specifically, the total flow rate of the $N_2$ gas may be set to 60 slm at 180 Pa. With such a configuration described above, it is possible to exhaust the by-products generated in one cycle of the second step S305. It is also possible to reduce the influence of the by-products on the subsequent cycle of the second step S305.

<Determination Step S305c>

In the determination step S305c, the controller 121 determines whether a cycle of the second step S305 including at least the third gas supply step S305a is performed a predetermined number of times (Y times). When the controller 121 determines, in the determination step S305c, that the cycle of the second step S305 is not performed the predetermined number of times ("NO" in FIG. 7), the cycle of the second step S305 is performed again. When the controller 121 determines, in the determination step S305c, that the cycle of the second step S305 is performed the predetermined number of times ("YES" in FIG. 7), a subsequent step such as a determination step S307 is performed. In the determination step S305c, for example, the predetermined number of times (Y times) may be set to be within a range from 3 times to 50 times, preferably from 20 times to 50 times. According to the present embodiments, by setting Y greater than X and setting a ratio (X:Y) to a ratio ranging from 1:2 to 1:4, it is possible to form a film whose characteristics are uniform on the surface of the wafer 200 or on the surface of the structure described above.

As described above, the second step S305 is performed. After the second step S305, the determination step S307 shown in FIG. 4 is performed.

<Determination Step S307>

In the determination step S307, the controller 121 determines whether a cycle of the film-forming step S300 is performed a predetermined number of times (Z times). When the controller 121 determines, in the determination step S307, that the cycle of the film-forming step S300 is not performed the predetermined number of times ("NO" in FIG. 4), the cycle of the film-forming step S300 is repeatedly performed. When the controller 121 determines, in the determination step S307, that the cycle of the film-forming step S300 is performed the predetermined number of times ("YES" in FIG. 4), a subsequent step such as a second film-forming step S404 is performed. In the determination step S307, for example, the predetermined number of times (Z times) may be set to be within a range from once to 200 times. According to the present embodiments, for example, the predetermined number of times (Z times) may be set such that the TiN film whose thickness is from 0.5 nm to 5.0 nm is formed by repeatedly performing the cycle of the film-forming step S300.

When performing the cycle of the film-forming step S300 a plurality of times, in order to remove the HCl and the $NH_4Cl$ described above, the time duration "T1+T2" of the pre-processing step S303a when performing the second or later cycle of the film-forming step S300 may be set to be longer than the time duration "T1+T2" of the pre-processing step S303a when performing the first cycle of the film-forming step S300. Thereby, it is possible to remove the HCl and the $NH_4Cl$ remaining in the process chamber 201.

<Second Film-Forming Step S404>

Subsequently, the second film-forming step S404 may be performed. The second film-forming step S404 is a step of repeatedly performing a gas supply sequence shown in FIG. 11 a predetermined number of times. By performing the second film-forming step S404, a TiN film is formed in the same manner as the steps described above. When the TiN film of a desired thickness is formed in the film-forming step S300, the second film-forming step S404 may be omitted. However, when the TiN film is formed in the film-forming step S300, the throughput of forming the TiN film in the film-forming step S300 may be lower than that of forming the TiN film in a conventional film-forming method. In such a case, an initial layer (first layer) of the TiN film within the desired thickness may be formed in the film-forming step S300, and then the second film-forming step S404 is performed in order to increase the thickness of the TiN film. Thereby, it is possible to suppress a decrease in the throughput of forming the TiN film.

<Atmosphere Adjusting Step S308>

In the atmosphere adjusting step S308, the $N_2$ gas is supplied into the process chamber 201 through each of the gas supply pipes 510, 520 and 530, and is exhausted through the exhaust pipe 231. The $N_2$ gas serves as a purge gas, and the inner atmosphere of the process chamber 201 is purged with the $N_2$ gas (that is, the inert gas). Thereby, the residual gas in the process chamber 201 or the by-products remaining in the process chamber 201 may be removed from the process chamber 201 (after-purge step). Thereafter, the inner atmosphere of the process chamber 201 is replaced with the inert gas (substitution by the inert gas), and the inner pressure of the process chamber 201 is returned to the normal pressure (atmospheric pressure) (returning to the atmospheric pressure step).

<Substrate Unloading Step S309>

Thereafter, in the substrate unloading step S309, the seal cap 219 is lowered by the boat elevator 115 and the lower end of the reaction tube 203 is opened. The boat 217 with the processed wafers 200 charged therein is unloaded out of the reaction tube 203 through the lower end of the reaction tube 203 (boat unloading step). Then, the processed wafers 200 are transferred (discharged) from the boat 217 (wafer discharging step).

(3) Effects According to Present Embodiments

According to the present embodiments described above, it is possible to provide one or more of the following effects.
(a) It is possible to efficiently discharge the HCl that is generated when the film is formed and that reduces the film-forming rate, and it is also possible to increase the film-forming rate.
(b) It is possible to reduce the silicon concentration in the film.
(c) It is possible to improve the coverage of the film. As shown in FIG. 10, according to the present embodiments, it is possible to improve the coverage since a ratio of titanium nitride (TiN) grains in a plane such as the surface of the wafer 200 can be increased. The coverage may be increased since the concentration of the HCl present in the process chamber 201 can be reduced and a magnitude of the steric hindrance due to the $TiCl_4$ formed on the wafer 200 can also be reduced by supplying the first gas and the second gas in a plurality of times.
(d) It is possible to improve an oxidation resistance. As shown in FIG. 10, by increasing a particle size of the film, it is possible to reduce grain boundaries (that is, it is possible to reduce a surface area of the film). Thereby, it is possible to improve the oxidation resistance.

Other Embodiments

While the technique of the present disclosure is described in detail by way of the embodiments described above, the above-described technique is not limited thereto. The above-described technique may be modified in various ways without departing from the gist thereof.

For example, the above-described embodiments are described by way of an example in which the $TiCl_4$ gas is used as the source gas. However, the above-described technique is not limited thereto. For example, the above-described technique may also be applied when a halogen-containing gas (preferably, a chlorine-containing gas) such as tungsten hexafluoride ($WF_6$) gas, tantalum tetrachloride ($TaCl_4$) gas, tungsten hexachloride ($WCl_6$) gas, tungsten pentachloride ($WCl_5$) gas, molybdenum tetrachloride ($MoCl_4$) gas, silicon tetrachloride ($SiCl_4$) gas and hexachlorodisilane (HCDS, $Si_2Cl_6$) gas is used as the source gas to form various types of films. For example, the above-described technique may also be applied when a tantalum (Ta)-based gas or a silicon-based gas such as trichlorodisilane (TCS) gas is used as the source gas to form various types of films.

For example, the above-described embodiments are described by way of an example in which the $SiH_4$ gas is used as the reducing gas of reducing the HCl. However, the above-described technique is not limited thereto. For example, the above-described technique may also be applied when a silane-based gas containing hydrogen (H) such as disilane ($Si_2H_6$) gas and trisdimethylaminosilane ($SiH[N(CH_3)_2]_3$) gas, a gas containing an element other than silicon and hydrogen such as diborane ($B_2H_6$) gas and phosphine ($PH_3$) gas, an active hydrogen-containing gas or a hydrogen-containing gas is used as the reducing gas.

For example, the above-described embodiments are described by way of an example in which a single reducing gas is used. However, the above-described technique is not limited thereto. For example, the above-described technique may also be applied when two or more reducing gases are used.

For example, the above-described embodiments are described by way of an example in which the HCl is used as the by-products reduced using the reducing gas. However, the above-described technique is not limited thereto. For example, the above-described technique may also be applied when a substance such as hydrogen fluoride (HF), hydrogen iodide (HI) and hydrogen bromide (HBr) is generated as the by-products.

For example, the above-described embodiments are described by way of an example in which the $TiCl_4$ gas serving as the source gas and the $SiH_4$ gas serving as the reducing gas are supplied through the nozzles 410 and 420 into the process chamber 201, respectively. However, the above-described technique is not limited thereto. For example, the above-described technique may also be applied when the source gas and the reducing gas are supplied into the process chamber 201 through the same nozzle by pre-mixing the source gas and the reducing gas.

For example, the above-described embodiments are described by way of an example in which the reducing gas is supplied simultaneously with or after the supply of the $TiCl_4$ gas or the reducing gas is supplied simultaneously with or after the supply of the $NH_3$ gas. However, the above-described technique is not limited thereto. For example, the above-described technique may also be applied to an example in which the reducing gas is supplied simultaneously with the supply of the $TiCl_4$ gas and the supply of the $NH_3$ gas, or an example in which the reducing gas is supplied after the supply of the $TiCl_4$ gas and after the supply of the $NH_3$ gas.

For example, the above-described embodiments are described by way of an example in which a batch type substrate processing apparatus configured to simultaneously process a plurality of substrates is used to perform the substrate processing of forming the film. However, the above-described technique is not limited thereto. For example, the above-described technique may be preferably applied when a single wafer type substrate processing apparatus configured to process one or several substrates at a time is used to perform the substrate processing.

For example, the above-described embodiments are described by way of an example in which a wafer serving as a semiconductor substrate is used. However, the above-described technique is not limited thereto. For example, the above-described technique may be preferably applied when a substrate processing using a substrate made of another material such as a ceramic substrate and a glass substrate is performed.

While the technique is described in detail by way of the embodiments and modified examples, the above-described technique is not limited thereto. The above-described embodiments and the modified examples may be appropriately combined.

As described above, according to some embodiments in the present disclosure, it is possible to improve the characteristics of the film.

What is claimed is:

1. A substrate processing method, comprising:
   (a) performing (a-1) supplying in parallel a metal-containing gas and a reducing gas that contains silicon and hydrogen and is free of halogen to a substrate, and (a-2) exhausting an inner atmosphere of a space in which the substrate is accommodated;
   (b) performing (a) a first number of times;
   (c) supplying a nitrogen-containing gas to the substrate and exhausting the inner atmosphere of the space; and
   (d) repeatedly performing (c) a second number of times after performing (b).

2. The method of claim 1, further comprising:
   (e) before (a), supplying a gas containing nitrogen and hydrogen to the substrate and thereafter purging the space.

3. The method of claim 1, wherein (a) further comprises:
   (a-3) adjusting an inner pressure of the space before supplying the metal-containing gas to be equal to that of the space when the metal-containing gas is being supplied.

4. The method of claim 1, wherein the metal-containing gas and the reducing gas are supplied in (a) such that an amount of the metal-containing gas supplied to the substrate is greater than an amount of the reducing gas supplied to the substrate.

5. The method of claim 1, wherein the metal-containing gas is supplied via a flash tank and the reducing gas is supplied without passing through any flash tank in (a).

6. The method of claim 1, wherein the second number of times is greater than the first number of times.

7. The method of claim 1, wherein (a) is repeatedly performed the first number of times in (b).

8. A method of manufacturing a semiconductor device, comprising the method of claim 1.

9. The method of claim 1, wherein a supply of the metal-containing gas and a supply of the reducing gas are stopped simultaneously in (a).

10. The method of claim 9, further comprising:
    (e) before (a), supplying a gas containing nitrogen and hydrogen to the substrate, and thereafter purging the space.

11. The method of claim 1, wherein a supply of the metal-containing gas is stopped after a supply of the reducing gas is stopped in (a).

12. The method of claim 11, further comprising:
    (e) before (a), supplying a gas containing nitrogen and hydrogen to the substrate, and thereafter purging the space after the gas containing nitrogen and hydrogen is supplied.

13. The method of claim 11, wherein (a) further comprises:
    (a-3) adjusting an inner pressure of the space before supplying the metal-containing gas to be equal to that of the space when the metal-containing gas is being supplied.

14. The method of claim 1, wherein the reducing gas is supplied after a supply of the metal-containing gas is started in (a).

15. The method of claim 14, wherein the supply of the metal-containing gas and a supply of the reducing gas are stopped simultaneously in (a).

16. The method of claim 14, wherein the supply of the metal-containing gas is stopped after a supply of the reducing gas is stopped in (a).

17. The method of claim 14, further comprising:
   (e) before (a), supplying a gas containing nitrogen and hydrogen to the substrate, and thereafter purging the space.

18. The method of claim 14, wherein (a) further comprises:
   (a-3) adjusting an inner pressure of the space before supplying the metal-containing gas to be equal to that of the space when the metal-containing gas is being supplied.

19. A non-transitory computer-readable recording medium storing a program that causes, by a computer, a substrate processing apparatus to perform:
   (a) performing (a-1) supplying in parallel a metal-containing gas and a reducing gas that contains silicon and hydrogen and is free of halogen to a substrate, and (a-2) exhausting an inner atmosphere of a space in which the substrate is accommodated;
   (b) performing (a) a first number of times;
   (c) supplying a nitrogen-containing gas to the substrate and exhausting the inner atmosphere of the space; and
   (d) repeatedly performing (c) a second number of times after performing (b).

20. A substrate processing apparatus comprising:
   a first gas supplier configured to supply a metal-containing gas to a substrate;
   a second gas supplier configured to supply a reducing gas containing silicon and hydrogen and free of halogen to the substrate;
   a third gas supplier configured to supply a nitrogen-containing gas to the substrate;
   an exhauster configured to exhaust an inner atmosphere of a space in which the substrate is accommodated; and
   a controller configured to be capable of controlling the first gas supplier, the second gas supplier, the third gas supplier and the exhauster to perform:
      (a) performing (a-1) supplying in parallel the metal-containing gas and the reducing gas to the substrate, and (a-2) exhausting the inner atmosphere of the space;
      (b) performing (a) a first number of times;
      (c) supplying the nitrogen-containing gas to the substrate and exhausting the inner atmosphere of the space; and
      (d) repeatedly performing (c) a second number of times after performing (b).

* * * * *